US009476922B2

(12) United States Patent
Kozakai et al.

(10) Patent No.: US 9,476,922 B2
(45) Date of Patent: Oct. 25, 2016

(54) MEASURING DEVICE, PROTECTION RELAY, AND PROGRAM PRODUCT

(75) Inventors: Yasuyuki Kozakai, Kanagawa (JP); Kotaro Ise, Kanagawa (JP); Shigeki Katayama, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 816 days.

(21) Appl. No.: 13/231,008

(22) Filed: Sep. 13, 2011

(65) Prior Publication Data

US 2012/0065907 A1  Mar. 15, 2012

(30) Foreign Application Priority Data

Sep. 15, 2010  (JP) ................................ 2010-207379

(51) Int. Cl.
G01R 19/25 (2006.01)
H02H 7/26 (2006.01)

(52) U.S. Cl.
CPC .......... G01R 19/2513 (2013.01); H02H 7/263 (2013.01); H02H 7/267 (2013.01)

(58) Field of Classification Search
USPC ....... 702/57–60, 62, 64, 65, 79, 85, 89, 106, 702/176, 177; 370/252, 519
See application file for complete search history.

(56) References Cited

U.S. PATENT DOCUMENTS 4,725,914 A * 2/1988 Garitty ............................ 361/76
7,693,607 B2 4/2010 Kasztenny et al.
2001/0021896 A1 * 9/2001 Bertsch et al. .................. 702/62
2004/0193881 A1 * 9/2004 Ayaki et al. .................... 713/168
2006/0259255 A1 * 11/2006 Anderson et al. ............... 702/64
2009/0327785 A1 * 12/2009 Chang et al. ................... 713/340
2010/0192001 A1 * 7/2010 Cornwall et al. .............. 713/400

FOREIGN PATENT DOCUMENTS

JP  2002-315233  10/2002
JP  2008-067595   3/2008

OTHER PUBLICATIONS

Tournier, Jean-Charles, et al., "Precise Time Synchronization on a High Available Redundant Ring Protocol", 2009 International IEEE Symposium on Precision Clock Synchronization for Measurement, Control and Communication, Italy, Oct. 12-16, 978-1-4244-4392.
Japanese Office Action for Japanese Application Serial No. 2010-207379 mailed on Aug. 14, 2012.

* cited by examiner

*Primary Examiner* — Mohamed Charioui
(74) *Attorney, Agent, or Firm* — Amin, Turocy & Watson LLP

(57) ABSTRACT

According to one embodiment, a measuring device includes a clock output unit, a receiving unit, an adjusting unit, a generating unit, and a transmitting unit. The clock output unit generates a clock, counts the clock, and outputs a count value. The receiving unit receives a first message including time information. The adjusting unit adjusts time at which acquires a physical amount on the basis of the time information included in the first message and the count value output from the clock output unit when the first message is received. The generating unit generates a second message including a value of the physical amount acquired at the adjusted time. The transmitting unit transmits the second message to a device, which is a transmission source of the first message.

4 Claims, 21 Drawing Sheets

FIG.4

CONVERSION PARAMETERS

| INDEX | DESTINATION ADDRESS | FREQUENCY (IN TERMS OF CLOCK OF PROTECTION RELAY) | TIME WHEN Sync IS RECEIVED (IN TERMS OF CLOCK OF PROTECTION RELAY) | CLOCK COUNTER WHEN Sync IS RECEIVED | FREQUENCY OF MEASUREMENT [NUMBER/SECOND] (IN TERMS OF CLOCK OF PROTECTION RELAY) | CLOCK COUNTER WHEN MEASUREMENT STARTS |
|---|---|---|---|---|---|---|
| 0 | 00:0E:7B:5B:D1:75 | 25001250 | 2010/21/07 15:37 .003213421 | 0x3212a9b34d9e00a3 | 4000 | 0x3212a9b34d9e3220 |
| 1 | 00:0E:7B:5B:D2:80 | 24998770 | 2010/21/07 15:36 .102340839 | 0x3212a9b34d9e3177 | 4800 | 0x3212a9b34d9e3230 |
| 2 | | | | | | |
| 3 | | | | | | |

PROTECTION RELAY

BUS PROTECTION RELAY

PHYSICAL AMOUNT SIGNAL

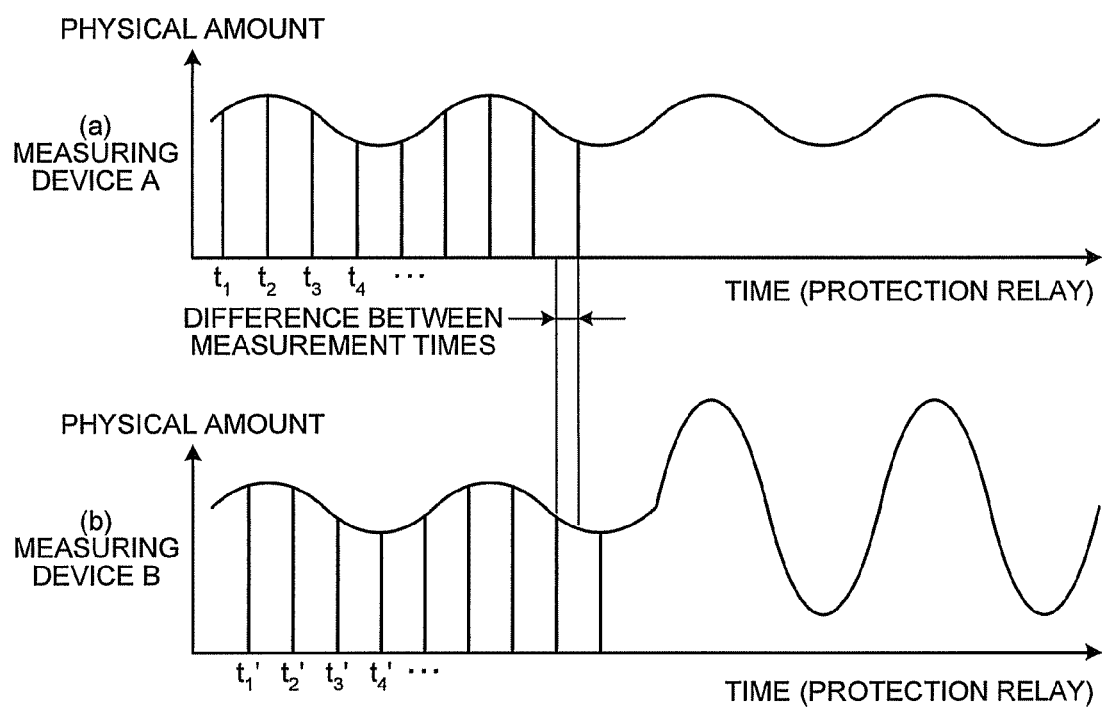

FIG.16

| INDEX | DESTINATION ADDRESS | CONVERSION PARAMETERS B | | |
|---|---|---|---|---|
| | | CLOCK RATE | TIME OF MEASURING DEVICE WHEN Sync IS RECEIVED | TIME OF PROTECTION RELAY WHEN Sync IS RECEIVED |
| 0 | 00:0E:7B:5B:D1:75 | 1000001250 | 2010/21/07 15:37 .003213421 | 0x3212a9b34d9e00a3 |
| 1 | 00:0E:7B:5B:D2:80 | 999999825 | 2010/21/07 15:36 .102340839 | 0x3212a9b34d9e3177 |
| 2 | | | | |
| 3 | | | | |
| | | | | |

FIG.17

MEASURING DEVICE A

| MEASUREMENT TIME (IN TERMS OF TIME OF RELAY) | 2010/21/07 15:37 .003213421 | 2010/21/07 15:37 .0032238421 | 2010/21/07 15:37 .0032263421 | ... | 2010/21/07 15:37 .103163421 | 2010/21/07 15:37 .1038883421 | 2010/21/07 15:37 .103213421 |
|---|---|---|---|---|---|---|---|
| PHYSICAL AMOUNT | 0 | 0.196147739 | 0.391086163 | | -0.391086163 | -0.196147739 | 0 |

MEASURING DEVICE B

| MEASUREMENT TIME (IN TERMS OF TIME OF RELAY) | 2010/21/07 15:37 .0032213451 | 2010/21/07 15:37 .0032238451 | 2010/21/07 15:37 .0032263451 | ... | 2010/21/07 15:37 .103163451 | 2010/21/07 15:37 .1038883451 | 2010/21/07 15:37 .103213451 |
|---|---|---|---|---|---|---|---|
| PHYSICAL AMOUNT | 0.019634752 | 0.215715914 | 0.410467116 | | -0.371681085 | -0.176567465 | 0.019634752 |

MEASURING DEVICE, PROTECTION RELAY, AND PROGRAM PRODUCT

CROSS-REFERENCE TO RELATED APPLICATION

This application is based upon and claims the benefit of priority from Japanese Patent Application No. 2010-207379, filed on Sep. 15, 2010; the entire contents of which are incorporated herein by reference.

FIELD

Embodiments described herein relate generally to a measuring device, a protection relay, and a program product.

BACKGROUND

A substation has a function of supplying power to consumers and includes a protection system that cuts off the supply of power to a position where a problem, such as an electric leakage, a ground fault, or the failure of a device, occurs immediately after the problem occurs. In order to detect the problem, a plurality of protection relays provided in the substation frequently measures physical amounts, such as the current and voltage value of electricity through a power line, at a plurality of points. In the typical substation, the protection relays are provided in a building and are connected to the measurement points of the power lines laid outside the building by a plurality of analog cables. Therefore, a large number of cables are laid at a long distance in the substation.

A transmission line protection system has been proposed which uses a digital network to reduce the number of cables in the substation. In the transmission line protection system, a measuring device (a merging unit or brick) is provided close to the power line, digitalizes physical amount input through a plurality of analog cables, and transmits the digital data to a protection relay through a small number of cables of a digital network, such as Ethernet (registered trademark). The protection system using the digital network can reduce the number of cables.

BRIEF DESCRIPTION OF THE DRAWINGS

FIG. 4 is a diagram illustrating data in a table according to the first embodiment;

FIG. 14 is a diagram illustrating the difference between the measurement times of two measuring devices;

FIG. 16 is a diagram illustrating data in a table according to the second embodiment;

FIG. 17 is a diagram illustrating an example of time-series data of a physical amount;

DETAILED DESCRIPTION

Figure 1:
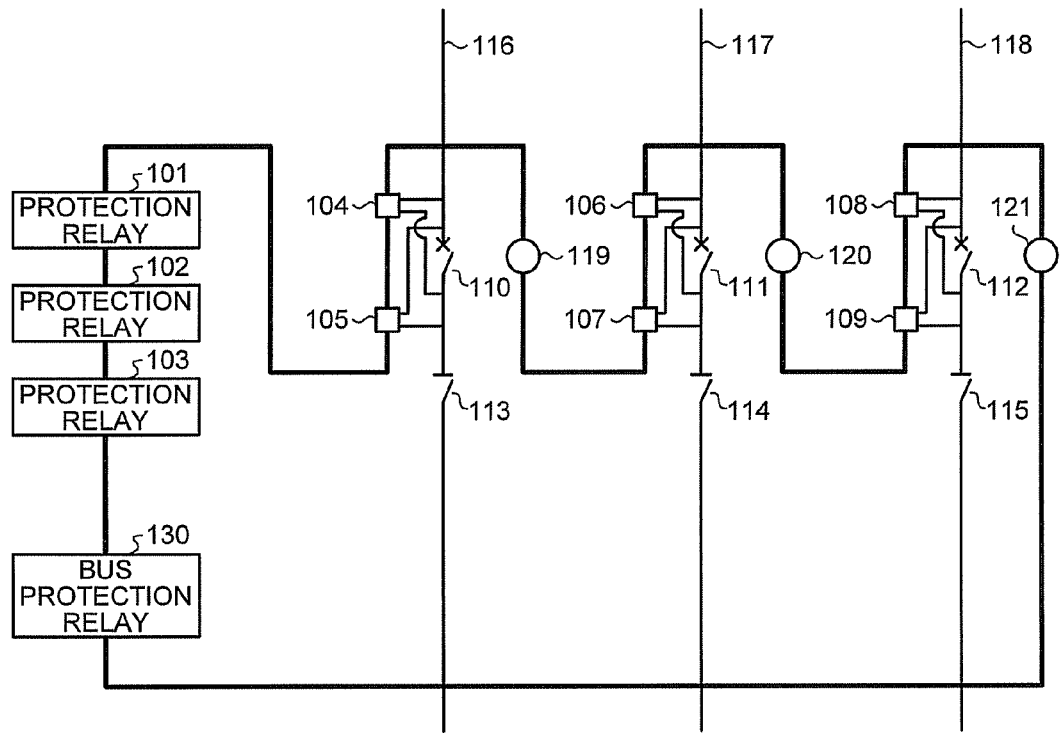
FIG. 1 is a diagram illustrating a transmission line protection system to which a measuring device according to a first embodiment can be applied.

In general, according to one embodiment, a measuring device includes, a clock output unit, a receiving unit, an adjusting unit, a generating unit, and a transmitting unit. The input unit inputs a physical amount. The clock output unit generates a clock, counts the clock, and outputs a count value. The receiving unit receives a first message including time information. The adjusting unit adjusts time at which acquires a physical amount is on the basis of the time information included in the first message and the count value output from the clock output unit when the first message is received. The generating unit generates a second message including a value of the physical amount acquired at the adjusted time. The transmitting unit transmits the second message to a device, which is a transmission source of the first message.

First Embodiment

A measuring device according to a first embodiment calculates the time difference between the measuring device and each of protection relays where the protection relays are the destinations of a message including a physical amount. In addition, the protection relays do not synchronize their time each other. The measuring device determines the measurement time of the physical amount on the basis of the time of the protection relays. That is, when a plurality of measuring devices transmit the physical amount to the same protection relay, the measuring devices measure the physical amount at the same time on the basis of the time of the protection relay. When one measuring device transmits the physical amount to a plurality of protection relays, the measuring device measures the physical amount at different times for each protection relay.

According to the first embodiment having the above-mentioned structure, even when there is an error in the time of a certain protection relay, the measurement time of the physical amount to be transmitted to another protection relay is not affected. Therefore, it is possible to prevent the error from being spread.

Next, a method of determining the measurement time according to the first embodiment will be described in detail. A transmission line protection system shown in FIG. 1 includes protection relays 101 to 103, measuring devices 104 to 109, breakers 110 to 112, switches 113 to 115, transmission lines 116 to 118, and a bus protection relay 130.

The protection relays 101 to 103, the measuring devices 104 to 109, and the bus protection relay 130 are connected to a digital network, such as Ethernet (registered trademark). The protection relays 101 to 103, the measuring devices 104 to 109, breaker controllers 119 to 121, and the bus protection relay 130 shown in FIG. 1 form a ring-type network. The ring-type network may be, for example, Highly Availability Seamless Ring defined by an international standard International Electrotechnical Commission 62439-3 (IEC62439-3) or a network corresponding to a media access control (MAC) system, such as Institute of Electrical and Electronics Engineers 802.5 (IEEE 802.5), IEEE 802.4, or a fiber distributed data interface (FDDI).

The measuring devices 104 to 109 measure the physical amounts related to the corresponding transmission lines 116 to 118, respectively. In this example, the measuring devices 104 and 105 measure the physical amount related to the transmission line 116. The measuring devices 106 and 107 measure the physical amount related to the transmission line 117. The measuring devices 108 and 109 measure the physical amount related to the transmission line 118.

The physical amounts measured by the measuring devices 104 to 109 are, for example, a values of voltage or current on the transmission lines 116 to 118. The AC frequency of the current may be measured as the physical amount. The embodiment is not limited thereto. For example, the measuring devices 104 to 109 may measure, as the physical amount, such as temperature, humidity, pressure, wind power, and the amount of water flow at a measurement point.

In a typical substation, two measuring devices are provided to measure the physical amount at two points such that the protection relay can acquire the physical amount at the same position even when one measuring device is out of order. In this way, the physical amount measuring units are redundantly provided. For example, in the example shown in FIG. 1, the measuring devices 104, 106, and 108 measure the physical amounts substantially at the same positions as those of the measuring devices 105, 107, and 109. In the first embodiment, the measuring devices may not be redundantly provided.

The measuring devices 104 to 109 receive a message (hereinafter, referred to as a Sync message) including time information indicating time from the protection relays 101 to 103 and the bus protection relay 130 through the network, according to the relation shown in FIG. 2. The protection relays 101 to 103 and the bus protection relay 130 write the time (hereinafter, referred to as a time information) indicating when the Sync message is transmitted, in the message.

For example, each of the measuring devices 104 to 109 receive the Sync message transmitted from the corresponding protection relay among the protection relays 101 to 103. In addition, each of the measuring devices 104 to 109 receives the Sync message transmitted from the bus protection relay 130. That is, the measuring devices 104 to 109 can receive the Sync message from a plurality of transmission sources. In addition, each of the protection relays 101 to 103 and the bus protection relay 130 can transmit the Sync message to a plurality of measuring devices.

The measuring devices 104 to 109 use the time information included in the Sync message to adjust the measurement time, measure the physical amount, and transmit a message (hereinafter, referred to as a physical amount data frame) including the value of the physical amount to the protection relays 101 to 103 and the bus protection relay 130 according to the relation shown in FIG. 2.

The measuring devices 104 to 109 adjust the time when they measure the physical amount for each of protection relays such that the measurement time interval indicated by the time of the protection relay is substantially constant. In addition, when the measurement time interval of the physical amounts transmitted to different protection relays (for example, the protection relay 101 and the bus protection relay 130) is within a predetermined time, the measuring devices 104 to 109 may perform measurement once.

The measuring devices 104 and 105 transmit the physical amount data frame to the protection relay 101, the measuring devices 106 and 107 transmit the physical amount data frame to the protection relay 102, and the measuring devices 108 and 109 transmit the physical amount data frame to the protection relay 103. In addition, each of the measuring devices 104 to 109 transmits the physical amount data frame to the bus protection relay 130. The measuring devices 104 to 109 may transmit the physical amount data frame in a unicast manner or a multi-cast manner.

The protection relays 101 to 103 analyze the physical amounts included in the physical amount data frames received from the measuring devices 104 to 109 and detect a problem in the transmission line. When a problem is detected, the protection relays 101 to 103 transmit a trip message to the breaker controllers 119 to 121 through the network. When the first embodiment is applied to a typical substation, the protection relays 101 to 103 and the bus protection relay 130 periodically transmit the Sync message, in which their own time is described, in the multi-cast manner. However, the embodiment is not limited thereto. The protection relays 101 to 103 and the bus protection relay 130 may periodically transmit the Sync message to the measuring devices 104 to 109 in the unicast manner according to the relation shown in FIG. 2.

Figure 2:
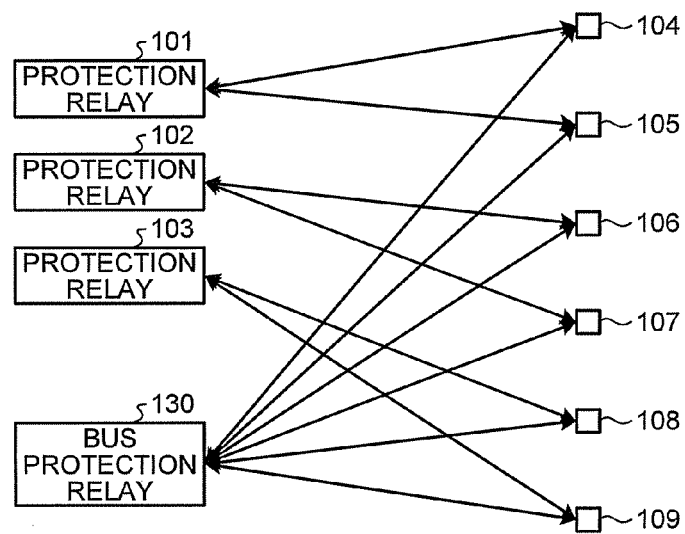
FIG. 2 is a diagram illustrating the relation between each measuring device and each protection relay.

The correspondence relation among the protection relays 101 to 103, the measuring devices 104 to 109, and the bus protection relay 130 is not limited to the relation shown in FIG. 2, but the protection relays 101 to 103, the measuring devices 104 to 109, and the bus protection relay 130 may be combined with each other in other ways. In particular, each of the measuring devices 104 to 109 may transmit the physical amount data frame to different numbers of protection relays. In this case, in the first embodiment, each of the measuring devices 104 to 109 receives at least the Sync message from a device, which is the destination of the physical amount data frame.

When receiving the trip message from the corresponding protection relays 101 to 103, the breaker controllers 119 to 121 transmit trip signals to the corresponding breakers 110 to 112, respectively. The breaker controllers 119 to 121 are respectively connected to the breakers 110 to 112 by analog control cables. The breakers 110 to 112 have a function of breaking the transmission lines 116, 117, and 118, respectively. The switches 113 to 115 have a function of connecting or disconnecting the transmission lines 116 to 118 for maintenance of the lines, as needed.

The measuring devices 104 to 109 shown in FIG. 1 may acquire the time of the protection relays 101 to 103 and the bus protection relay 130 using any method. For example, the protection relays 101 to 103, the measuring devices 104 to 109, and the bus protection relay 130 may have a function based on IEEE 1588 or a network time protocol (NTP). In the first embodiment, an example in which the protection relays 101 to 103, the measuring devices 104 to 109, and the bus protection relay 130 are based on a one-step mode of IEEE 1588 and a system called a peer delay mechanism will be described.

When the protection relays 101 to 103, the measuring devices 104 to 109, and the bus protection relay 130 transfer the Sync message, information indicating estimated processing time is included in the Sync message. In addition, each of the protection relays 101 to 103, the measuring devices 104 to 109, and the bus protection relay 130 has a function of transmitting a Pdelay_Req message to an adjacent device, a function of receiving the Pdelay_Req message from an adjacent device and returning a Pdelay_Response message, and a function of receiving the Pdelay_Response message and calculating the transmission delay time of the cable connected to an adjacent device.

The Pdelay_Req message includes information indicating the time when the Pdelay_Req message is transmitted. In addition, the Pdelay_Response message includes information indicating the time when the Pdelay_Req message is received and the time when the Pdelay_Response message is transmitted.

Figure 3:
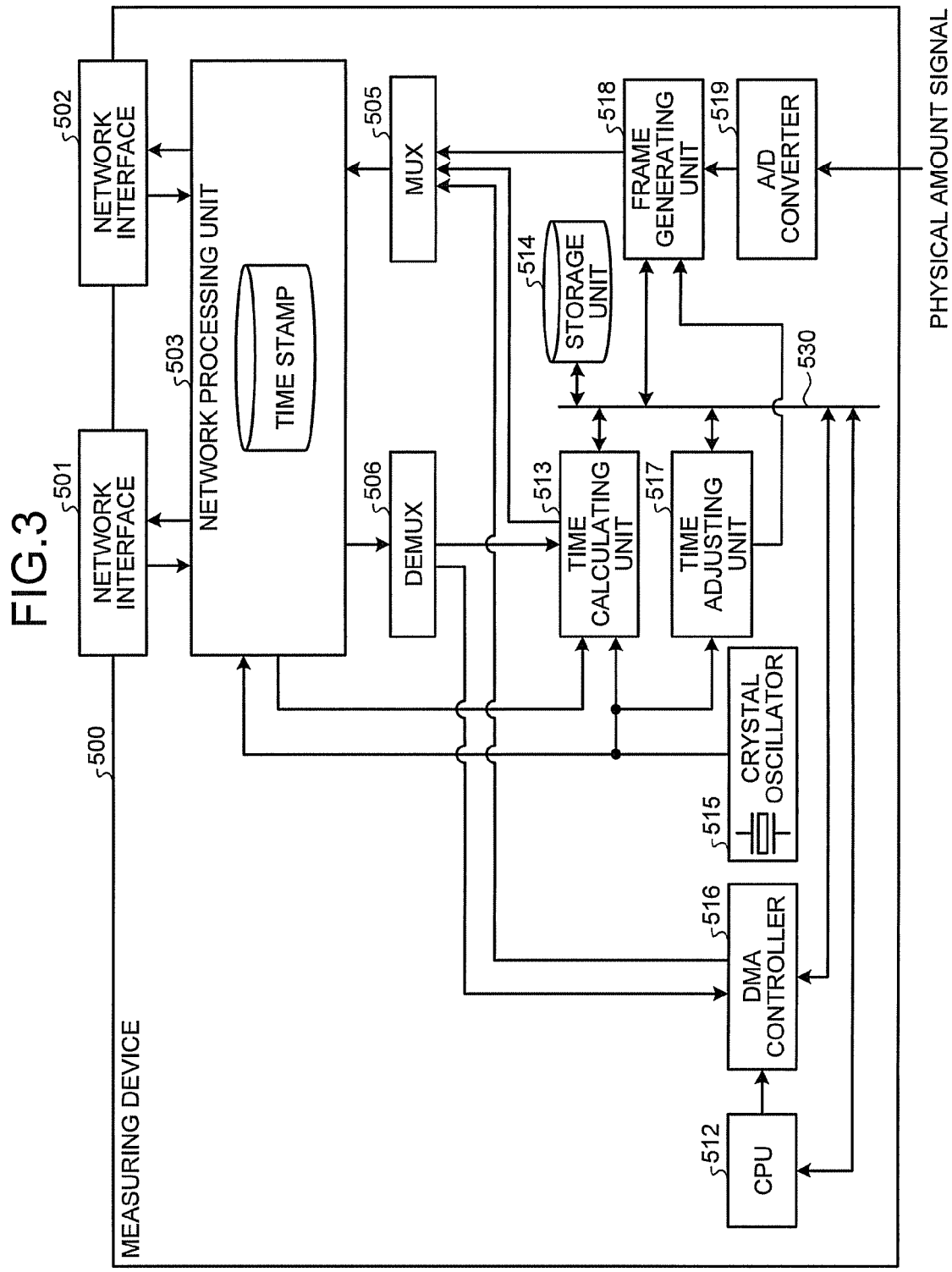
FIG. 3 is a block diagram illustrating the structure of the measuring device according to the first embodiment.

In FIG. 3, a measuring device 500 corresponds to the measuring devices 104 to 109 shown in FIG. 1. The measuring device 500 according to the first embodiment includes network interfaces 501 and 502, a network processing unit 503, a multiplexer (MUX) 505, a demultiplexer (DEMUX) 506, a central processing unit (CPU) 512, a time calculating unit 513, a storage unit 514, a direct memory access (DMA) controller 516, a crystal oscillator 515, a time adjusting unit 517, a frame generating unit 518, and an A/D converter 519.

The CPU 512 is, for example, a general-purpose processor and controls the overall operation of the measuring device 500 using a random access memory (RAM) (not shown) as a work memory, according to programs stored in the storage unit 514. A bus 530 connects the CPU 512, the time calculating unit 513, the storage unit 514, the DMA controller 516, the time adjusting unit 517, and the frame generating unit 518 such that they can communicate with each other.

The crystal oscillator 515 includes an oscillator that uses crystal and is oscillated at a predetermined frequency and a clock counter that counts the number of oscillations of an oscillation signal generated by the oscillator. The time calculated from the value of the clock counter output from the crystal oscillator 515 corresponds to the time information indicating the time of the measuring device 500. The value of the clock counter is provided to the network processing unit 503, the time calculating unit 513, and the time adjusting unit 517.

The network interfaces 501 and 502 are interfaces corresponding to a communication system, such as Ethernet (registered trademark) or a wireless local area network (LAN). The network processing unit 503 performs a media access control (MAC) process corresponding to the communication system and outputs an input frame to an appropriate module, which is an output destination. The network processing unit 503 selects an output destination module, according to a module, which is the destination of the frame, and a module, which is the input source of the frame. Specifically, the network processing unit 503 outputs the frame input from the MUX 505 to at least one of the network interfaces 501 and 502.

The network processing unit 503 outputs the frame which is input from the network interface 501 or 502 and whose destination address is the measuring device 500 to the DEMUX 506. The network processing unit 503 outputs the frame which is input from the network interface 501 and whose destination address is a unicast address and is not the measuring device 500 to the network interface 502. Similarly, the network processing unit 503 outputs the frame which is input from the network interface 502 and whose destination address is a unicast address and is not the measuring device 500 to the network interface 501.

The network processing unit 503 outputs the frame which is input from the network interface 501 and whose destination address is a multi-cast address to the network interface 502 and the DEMUX 506. Similarly, the network processing unit 503 outputs the frame which is input from the network interface 502 and whose destination address is a multi-cast address to the network interface 501 and the DEMUX 506.

The network processing unit 503 may discard the same frame that has been received once among the frames input from the network interface 501 or 502.

When the frame is input to or output from the network interface 501 or 502, the network processing unit 503 stores the value of the clock counter of the crystal oscillator 515 as a time stamp indicating the input or output time of the frame. The MUX 505 acquires a frame from any one of a plurality of modules and transmits the frame. The DEMUX 506 outputs the Sync message to the time calculating unit 513 and transmits at least frames other than the Sync message to the DMA controller 516.

However, the embodiment is not limited thereto. The DEMUX 506 may output the Sync message to the time calculating unit 513 and the DMA controller 516. In addition, the DEMUX 506 may output the Pdelay_Req message and the Pdelay_Response message to at least one of the time calculating unit 513 and the DMA controller 516.

The time calculating unit 513 calculates the time of the protection relay by using the time information which is included in the input Sync message and indicates the time when the Sync message is transmitted. In addition, the time calculating unit 513 stores parameters (hereinafter, referred to as conversion parameters) for converting the time of the protection relay to the value of the clock counter of the crystal oscillator 515 in the storage unit 514.

The storage unit 514 is, for example, a volatile semiconductor memory, a nonvolatile semiconductor memory or a hard disk drive and stores programs executed by the CPU 512. In addition, the storage unit 514 includes a table including at least one record composed of the address of the protection relay communicating with the measuring device 500, the conversion parameters, the frequency of measurement of the physical amount, and the value of the clock counter at which measurement is to be started.

Data shown in FIG. 4 is stored as a table including records for the protection relay or the bus protection relay in the storage unit 514. Each record is identified by an index. The address of the protection relay is used by the measuring device 500 to access the protection relay. For example, the MAC address of Ethernet (registered trademark) may be used as the address of the protection relay. However, the embodiment is not limited thereto. For example, the Internet protocol (IP) address of the protection relay may be used as the address of the protection relay.

The conversion parameters are, for example, the frequency (referred to as a converted frequency) of the crystal oscillator 515 in terms of the time of the protection relay, the estimated time of the protection relay when the Sync message is received, and the value of the clock counter of the crystal oscillator 515 when the Sync message is received. The converted frequency may be calculated on the basis of, for example, the ratio of the difference between the time information items included in two Sync messages and the difference between the time stamps stored in the network processing unit 503 when the two Sync messages are received by the network interface 501 or 502.

The converted frequency indicates the difference between the clock rate of the protection relay and the clock rate of the measuring device 500. That is, the converted frequency and the frequency in the specification of the crystal oscillator 515 are compared with each other to know the difference between one second defined by the clock for measuring the time of the protection relay and one second defined by the clock counter output from the crystal oscillator 515 of the measuring device 500.

In the example shown in FIG. 4, the conversion parameters include the frequency of measurement of the physical amount and the value of the clock counter at which measurement is to be started. The frequency of measurement of the physical amount is, for example, the number of times the measuring device 500 measures the physical amount per second in terms of the time of the protection relay. The value of the clock counter at which measurement is to be started is a predetermined value or a value which is notified from the protection relay and is obtained by converting the time of the protection relay to the value of the clock counter of the crystal oscillator 515. The measuring device 500 starts a measuring operation if the value of the clock counter is equal to a value designated by the clock counter at which measurement is to be started.

The DMA controller 516 outputs the frame generated by the CPU 512 to the MUX 505 and stores the frame input from the DEMUX 506 in the storage unit 514. The time adjusting unit 517 determines the time when the measuring device 500 measures the physical amount. In addition, the time adjusting unit 517 includes a counter that holds the number of clocks until the next measurement time of the physical amount.

The A/D converter 519 converts an analog signal (physical amount signal) of the physical amount measured by an external apparatus into a physical amount composed of digital data. The A/D converter 519 corresponds to the measuring unit in the first embodiment. When receiving a signal indicating the measurement time from the time adjusting unit 517, the frame generating unit 518 acquires the digitalized physical amount from the A/D converter 519 and generates a physical amount data frame including the value of the physical amount. The generated physical amount data frame is output to the MUX 505.

Figure 5:
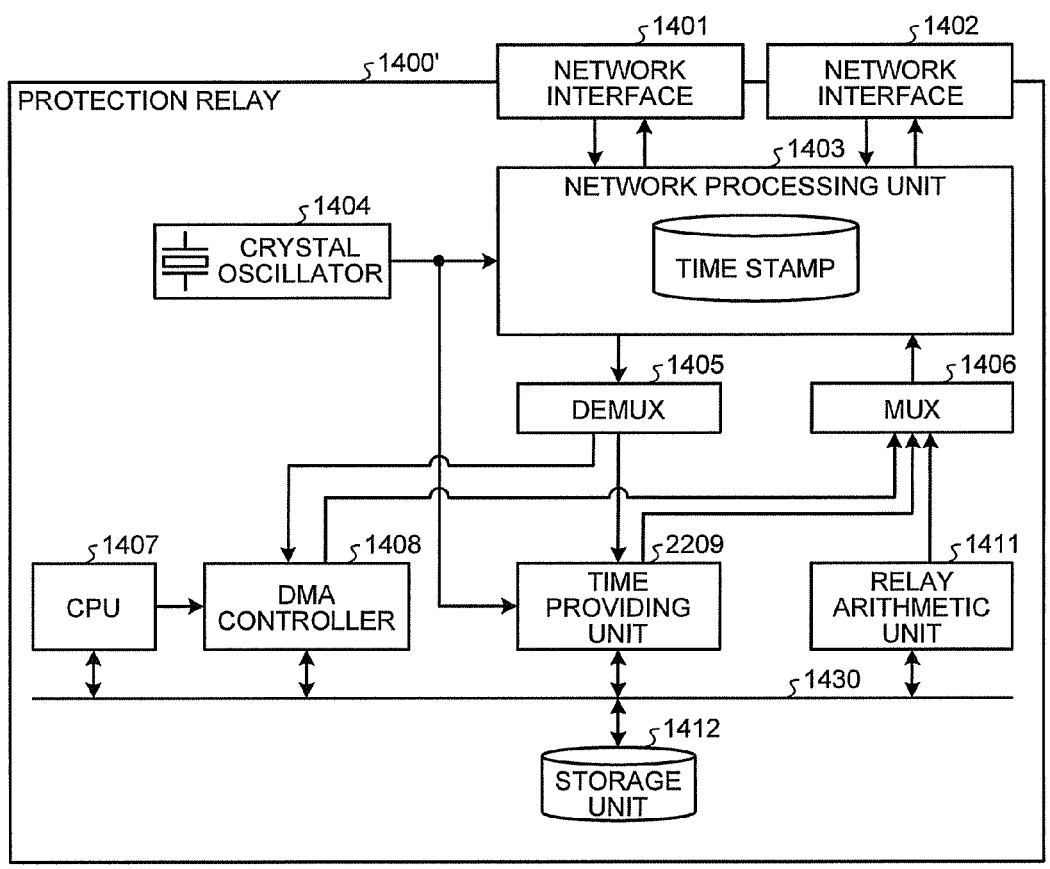
FIG. 5 is a diagram illustrating the structure of a protection relay to which the first embodiment can be applied.

A protection relay 1400' shown in FIG. 5 corresponds to the protection relays 101 to 103 and the bus protection relay 130 shown in FIG. 1. The protection relay 1400' includes network interfaces 1401 and 1402, a network processing unit 1403, a crystal oscillator 1404, a DEMUX 1405, a MUX 1406, a CPU 1407, a DMA controller 1408, a time providing unit 2209, a relay arithmetic unit 1411, and a storage unit 1412.

The CPU 1407 is, for example, a general-purpose processor and controls the overall operation of the protection relay 1400' using a RAM (not shown) as a work memory, according to programs stored in the storage unit 1412. A bus 1430 connects the CPU 1407, the time providing unit 2209, the storage unit 1412, the DMA controller 1408, and the relay arithmetic unit 1411 so as to communicate with each other.

The network interfaces 1401 and 1402, the network processing unit 1403, the crystal oscillator 1404, and the DMA controller 1408 are respectively equivalent to the modules of the network interfaces 501 and 502, the network processing unit 503, the crystal oscillator 515, and the DMA controller 516 in the measuring device 500 described with reference to FIG. 3 and a detailed description thereof will not be repeated.

In the protection relay 1400', the DEMUX 1405 transmits a Pdeley_Response message and a Pdeley_Req message received from the network interface 1401 or 1402 to the time providing unit 2209. In addition, the DEMUX 1405 transmits the physical amount data frame received from the network interface 1401 or 1402 to the DMA controller 1408. The DMA controller 1408 transmits the physical amount data frame received from the DEMUX 1405 to the CPU 1407 and the relay arithmetic unit 1411.

The MUX 1406 acquires the frame from the DMA controller 1408, the time providing unit 2209, and the relay arithmetic unit 1411 and transmits it to the network processing unit 1403.

The time providing unit 2209 periodically generates the Sync message on the basis of the value of the clock counter output from the crystal oscillator 1404. The generated Sync message is transmitted to the network processing unit 1403 through the MUX 1406 and is then transmitted by the network interface 1401 or 1402.

In addition, the time providing unit 2209 generates a Pdeley_Req message and a Pdeley_Response message. The generated Pdeley_Req message and Pdeley_Response message are transmitted to the network processing unit 1403 through the MUX 1406 and are then transmitted by the network interface 1401 or 1402. The time providing unit 2209 processes the Pdeley_Req message and the Pdeley_Response message which are received by the network interface 1401 or 1402 and are then transmitted thereto through the network processing unit 1403 and the DEMUX 1405.

The storage unit 1412 is, for example, a hard disk drive, a volatile semiconductor memory or a nonvolatile semiconductor memory and stores programs executed by the CPU 1407. In addition, the storage unit 1412 stores the address of each measuring device, which is a transmission destination, and stores the value of the physical amount included in the physical amount data frame which is received by the network interface 1401 or 1402 from each of a plurality of measuring devices. The relay arithmetic unit 1411 verifies whether there is a problem in the transmission line on the basis of a plurality of physical amount information items stored in the storage unit 1412.

Figure 6:
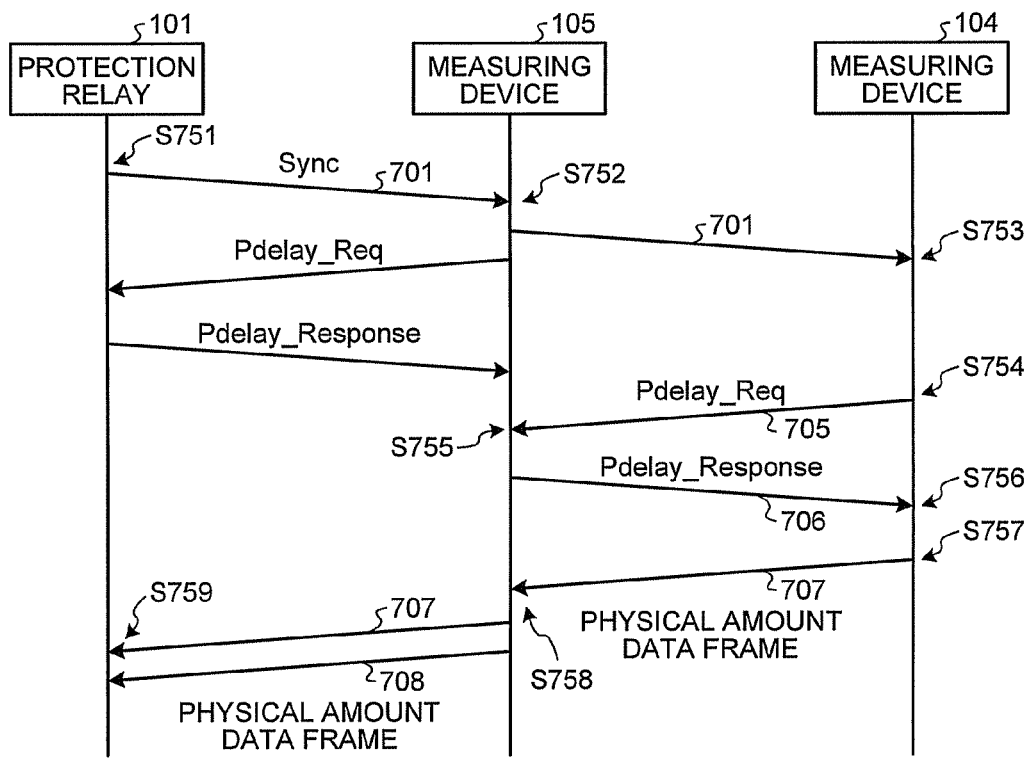
FIG. 6 is a sequence diagram illustrating a process of transmitting a physical amount data frame.

Next, the process performed by the measuring device according to the first embodiment will be described. FIG. 6 is a diagram illustrating an example of a process when the measuring device 104 transmits the physical amount data frame having the value of the physical amount described therein to the protection relay 101. In the example shown in FIG. 1, the protection relay 101 receives the physical amount data frame output from the measuring device 104 through the measuring device 105.

The sequence shown in FIG. 6 is classified into three sequences, that is, the first to third sequences. In the first sequence, the measuring device 104 receives the Sync message which is periodically transmitted from the protection relay 101 and checks the time of the protection relay 101 on the basis of the received Sync message. In the second sequence, the measuring device 105 and the measuring device 104 periodically measure a communication delay in the cable between adjacent devices. In the third sequence, the measuring device 104 periodically transmits the physical amount data frame to the protection relay 101.

The first to third sequences may be performed at different times, or the first to third sequences may be performed in any order. In the first embodiment, the second sequence may not be performed. The second sequence is performed in order to measure the communication delay of the Sync message with high accuracy. When the communication delay is measured with high accuracy, the measuring device can check the time of the protection relay with high accuracy. When high-accuracy measurement is not needed, the measuring device may not perform the second sequence.

First, the first sequence will be described. The protection relay 101 transmits a Sync message 701 to the network (Step S751). The destination address of the Sync message 701 is the address of the measuring device 104 or a multi-cast address. The measuring device 105 receives the Sync message 701 in Step S752.

The measuring device 105 transfers the Sync message 701 received in Step S752 to the measuring device 104. A process of transferring the Sync message 701 in Step S752 will be described with reference to FIG. 3. It is assumed that the network interface 501 receives the Sync message 701 in the measuring device 105 (measuring device 500). The network interface 501 outputs the received Sync message 701 to the network processing unit 503. The network processing unit 503 acquires the value of the clock counter output from the crystal oscillator 515 as a time stamp.

Since the destination address of the Sync message 701 is the address of the measuring device 104 or a multi-cast address, the network processing unit 503 outputs the Sync message 701 to the network interface 502. When the destination address of the Sync message 701 is a multi-cast address, the network processing unit 503 also outputs the Sync message 701 to the DEMUX 506. The network interface 502 outputs the Sync message 701 received from the network processing unit 503 to the network.

The network processing unit 503 may calculate a value D_new_correction using the following Expression (1) on the basis of D_trans which is the processing time to transfer the Sync message 701, a value D_old_correction written in a Correction field of the Sync message 701, and a communication delay D_pdelay between the measuring device 105 and the protection relay 101:

$$D\_new\_correction = D\_trans + D\_old\_correction + D\_pdelay \quad (1)$$

The calculation result may be included in the Correction field of the Sync message 701. In addition, D_trans may be a predetermined value.

Immediately before the frame is output to the network interface 502 and when the transmission processing time is calculated, the network processing unit 503 may acquire a clock counter value C_trans of the crystal oscillator 515 and calculate D_trans using the following Expression (2) on the basis of a time stamp C_in when the frame is input from the network interface 501, a predetermined processing time D_proc_correction in the Correction field, and a predetermined frequency f of the crystal oscillator 515:

$$D\_trans = f \times (C\_trans - C\_in + D\_proc\_correction) \quad (2)$$

The above is the process of the measuring device 105 in Step S752.

The measuring device 104 receives the Sync message 701 in Step S753. A process of receiving the Sync message 701 in Step S753 will be described with reference to FIG. 3. It is assumed that the network interface 501 receives the Sync message 701 in the measuring device 104 (measuring device 500). The network interface 501 outputs the Sync message 701 to the network processing unit 503. The network processing unit 503 acquires the value of the clock counter output from the crystal oscillator 515 as a time stamp.

Since the destination address of the Sync message 701 is the address of the measuring device 104 or a multi-cast address, the network processing unit 503 outputs the Sync message 701 to the DEMUX 506. When the destination address of the Sync message 701 is a multi-cast address, the network processing unit 503 also outputs the Sync message 701 to the network interface 502. The subsequent process is the same as the process in Step S752.

Then, the DEMUX 506 determines the output destination of the Sync message 701. When an input frame is the Sync message 701, the DEMUX 506 outputs the frame to the time calculating unit 513 and outputs all of the other frames to the DMA controller 516. In this case, since the input frame is the Sync message 701, the DEMUX 506 outputs the Sync message 701 to the time calculating unit 513.

The time calculating unit 513 acquires the value of the clock counter when the Sync message 701 is received from the network processing unit 503. Then, the time calculating unit 513 converts the oscillating frequency of the crystal oscillator 515 into the clock of the protection relay 101 to calculate a converted frequency. Specifically, the time calculating unit 513 calculates the converted frequency, using the transmission time T_sync_send of the Sync message 701 which is described in the Sync message 701, the transmission time of the previously received Sync message which is stored in the storage unit 514, the value of the clock counter which is stored as the time stamp in the network processing unit 503 when the Sync message 701 is received, the value of the clock counter which is stored as the time stamp when the previous Sync message is received, and the communication delay D_sync of the Sync message 701.

The communication delay D_sync of the Sync message 701 may be a predetermined value. However, the embodiment is not limited thereto. For example, the communication delay D_sync of the Sync message 701 may be a value which is written in the Correction field of the Sync message 701. In addition, the communication delay D_sync of the Sync message 701 may be the sum of the value which is written in the Correction field of the Sync message 701 and the communication delay between the measuring device 105 and the measuring device 104 which is measured in the second sequence.

The time calculating unit 513 may calculate the converted frequency in terms of the clock of the protection relay 101 using a proportional-integral (PI) control method, a recurrence analysis method, or a linear programming method. In addition, the time calculating unit 513 may store, in the storage unit 514, the reception time of one or more Sync messages which are received before the reception time of the current and previous Sync messages and the value of the clock counter as well as the reception time of the Sync message and the value of the clock counter when the current and previous Sync messages are received, and use the stored data in order to calculate the converted frequency. In this way, for example, when the recurrence analysis method or the linear programming method is used, it is possible to estimate the converted frequency with high accuracy.

The time calculating unit 513 stores the converted frequency obtained by converting the oscillating frequency of the crystal oscillator 515 into the clock of the protection relay 101 in the storage unit 514.

In addition, the time calculating unit 513 calculates the time T_sync_est_recv of the protection relay 101 when the Sync message 701 is received using the following Expression (3) and stores the time in the storage unit 514:

$$T\_sync\_est\_recv = T\_sync\_send + D\_sync \quad (3)$$

Furthermore, the time calculating unit 513 stores the value of the clock counter when the Sync message 701 is received in the storage unit 514. The above is the process of the measuring device 104 in Step S753.

Next, the second sequence will be described. In the second sequence, a delay between adjacent devices is measured. The measuring device 105 and the measuring device 104 periodically transmit the Pdelay_Req message to an adjacent device and receive the Pdelay_Response message transmitted from the adjacent device. FIG. 6 shows an aspect in which the measuring device 104 measures a communication delay between the measuring device 104 and the measuring device 105 and the measuring device 105 measures a communication delay between the measuring device 105 and the protection relay 101. The same processing method is performed between the adjacent devices. A method of measuring the communication delay between the measuring device 104 and the measuring device 105 will be described below.

The measuring device 104 transmits a Pdelay_Req message 705 in Step S754. The process in Step S754 will be described with reference to FIG. 3. The time calculating unit 513 of the measuring device 104 (measuring device 500) generates the Pdelay_Req message 705. The MUX 505 acquires the Pdelay_Req message 705 from the time calculating unit 513 and outputs the acquired message to the network processing unit 503. The network processing unit 503 calculates the estimated transmission time of the Pdelay_Req message 705 using the value of the clock counter of the crystal oscillator 515 and describes estimated transmission time information indicating the transmission time in the Pdelay_Req message 705.

The network processing unit 503 outputs the Pdelay_Req message 705 to at least one of the network interface 501 and the network interface 502. The network interface 501 and/or the network interface 502 outputs the Pdelay_Req message 705 to the network. The above is the process of the measuring device 104 in Step S754.

The measuring device 105 receives the Pdelay_Req message 705 in Step S755. The process of the measuring device 105 in Step S755 will be described with reference to FIG. 3. It is assumed that the measuring device 105 receives the Pdelay_Req message 705 using the network interface 502. The network interface 502 outputs the received Pdelay_Req message 705 to the network processing unit 503.

Then, the network processing unit 503 acquires from the crystal oscillator 515 the value of the clock counter when the Pdelay_Req message 705 is input. The network processing unit 503 outputs the Pdelay_Req message 705 to the DEMUX 506. The DEMUX 506 outputs the Pdelay_Req message 705 to the time calculating unit 513. The time calculating unit 513 generates a Pdelay_Response message 706 according to the Pdelay_Req message 705. Then, the time calculating unit 513 acquires from the network processing unit 503 the value of the clock counter when the Pdelay_Req message 705 is received.

Then, the time calculating unit 513 describes the transmission time of the Pdelay_Req message 705 and the reception time of the Pdelay_Req message 705 which are described in the Pdelay_Req message 705 in the Pdelay_Response message 706. The time calculating unit 513 outputs the Pdelay_Response message 706 to the MUX 505.

The MUX 505 acquires the Pdelay_Response message 706 output from the time calculating unit 513 and outputs it to the network processing unit 503. The network processing unit 503 describes the estimated transmission time of the Pdelay_Response message 706 in the Pdelay_Response message 706. The network processing unit 503 outputs the Pdelay_Response message 706 to the network interface 502. The network interface 502 transmits the Pdelay_Response message 706. The above is the process in Step S755.

The measuring device 104 receives the Pdelay_Response message 706 in Step S756. The process of the measuring device 104 in Step S756 will be described below with reference to FIG. 3. It is assumed that the measuring device 104 receives the Pdelay_Response message 706 using the network interface 501. The network interface 501 outputs the received Pdelay_Response message 706 to the network processing unit 503. The network processing unit 503 acquires the value of the clock counter of the crystal oscillator 515 when the Pdelay_Response message 706 is input. Then, the network processing unit 503 outputs the Pdelay_Response message 706 to the DEMUX 506.

The DEMUX 506 outputs the Pdelay_Response message 706 to the time calculating unit 513. The time calculating unit 513 calculates a communication delay Pd_delay using, for example, the following Expression (4) on the basis of the transmission time Pd_req_send of the Pdelay_Req message 705, the reception time Pd_req_recv of the Pdelay_Req message 705, the transmission time Pd_resp_send of the Pdelay_Response message 706, and the reception time Pd_resp_recv of the Pdelay_Response message 706:

$$Pd\_delay = \{(Pd\_req\_recv - Pd\_req\_send) + (Pd\_resp\_recv - Pd\_resp\_send)\}/2 \quad (4)$$

When the converted frequency is calculated in Step S753, the time calculating unit 513 may use the communication delay Pd_delay as the communication delay D_pdelay between the measuring device 104 and the measuring device 105. However, the embodiment is not limited thereto. For example, the time calculating unit 513 may calculate the communication delay Pd_delay and the communication delay D_pdelay between the measuring device 104 and the measuring device 105 using the value of one or more communication delays Pd_delay which have been previously calculated. For example, there is a method of using the average value of one or more communication delays Pd_delay which have been previously calculated. The above is the process in Step S756.

Next, the third sequence will be described. In the third sequence, the measuring device 104 transmits the value of the physical amount to the protection relay 101. First, the measuring device 104 transmits a physical amount data frame 707 to the network in Step S757.

The process of the measuring device 104 (measuring device 500) in Step S757 will be described with reference to FIGS. 3 and 7. The time adjusting unit 517 includes a down counter (not shown) that stores the number of clocks until the measurement time of the physical amount. In addition, the time adjusting unit 517 stores an index indicating a record of a device (protection relay) which is the destination of the next physical amount to be measured.

Figure 7:
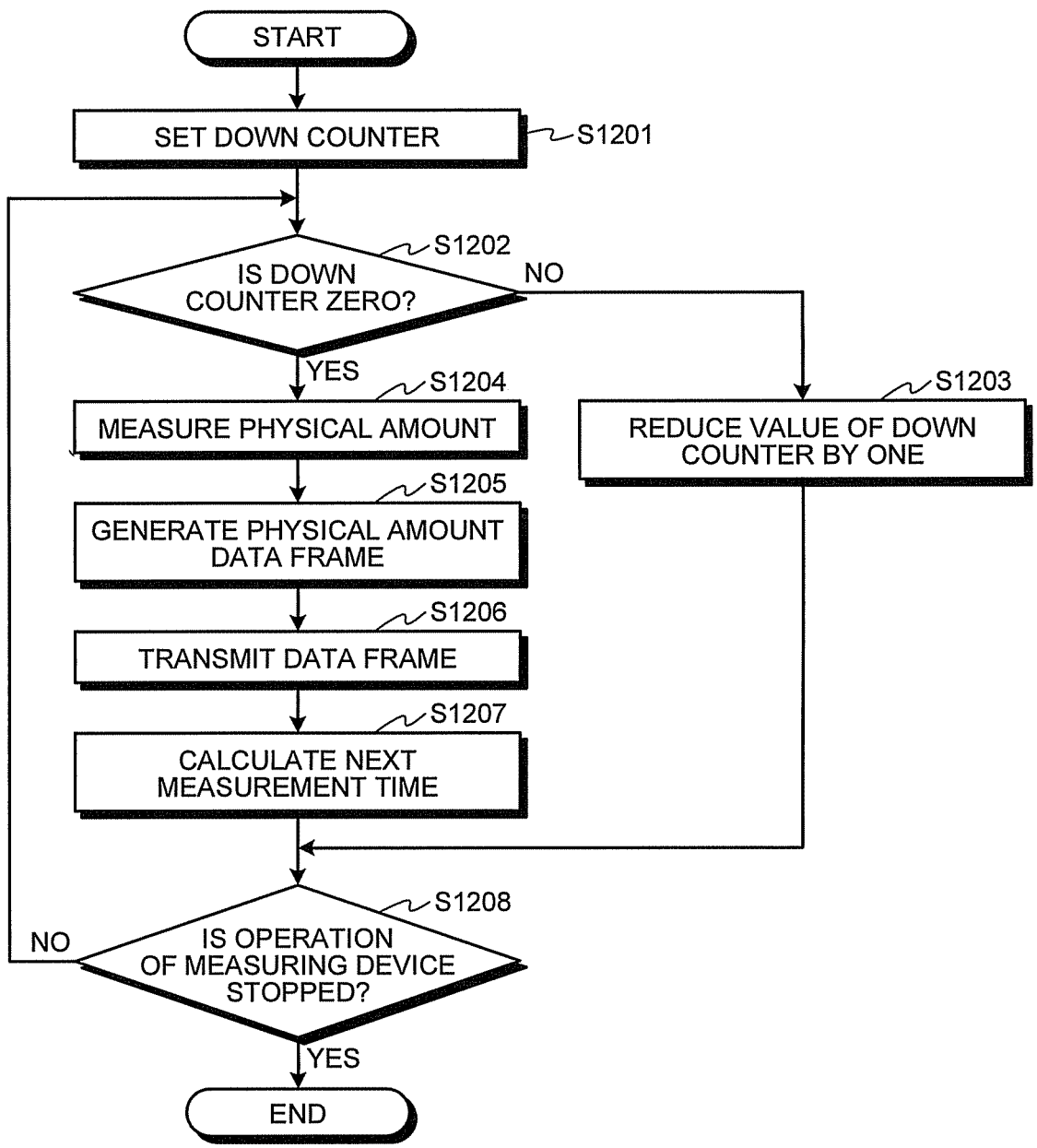
FIG. 7 is a flowchart illustrating the process of transmitting the physical amount data frame according to the first embodiment.

In Step S1201 shown in FIG. 7, the time adjusting unit 517 sets, to the down counter, a value obtained by subtracting the current value of the clock counter of the crystal oscillator 515 from the value of the clock counter at which measurement is to be started in the table stored in the storage unit 514 (Step S1201).

In Step S1202, when receiving a clock counter signal from the crystal oscillator 515, the time adjusting unit 517 determines whether the value of the down counter is "0." When it is determined that the value is more than "0," the process proceeds to Step S1203 and the value of the down counter is reduced by 1. When the operation of the measuring device 104 is not stopped (Step S1208), the process returns to Step S1202.

For example, the operation of the measuring device 104 is stopped when the operator stops the operation of the measuring device 104. In FIG. 7, in Step S1208, it is determined whether the operation of the measuring device 104 is stopped. When power is turned off to stop the operation of the measuring device 104, the determination process is not performed.

On the other hand, when it is determined in Step S1202 that the value of the down counter is "0," the time adjusting unit 517 proceeds to Step S1204 shown in FIG. 7. In Step S1204, the time adjusting unit 517 outputs the index to the frame generating unit 518. When receiving the index from the time adjusting unit 517, the frame generating unit 518 acquires the digitalized physical amount from the A/D converter 519. Then, the frame generating unit 518 generates the physical amount data frame 707 having the value of the physical amount described therein (Step S1205). The frame generating unit 518 may set the destination address of the physical amount data frame 707 to the address of the protection relay which is stored in the record indicated by the index. The MUX 505 acquires the physical amount data frame 707 from the frame generating unit 518 and outputs it to the network processing unit 503.

The frame generating unit 518 may describe information indicating the measurement time of the physical amount in the physical amount data frame 707. The information indicating the measurement time may be, for example, a sequence number indicating the order of messages transmitted to the network. Time information (time stamp) based on the clock counter may be used as the information indicating the measurement time. When the information indicating the measurement time is described in the physical amount data frame 707, the protection relay receiving the physical data frames from a plurality of measuring devices can know the relation between the measurement times of the physical amounts described in the physical data frames. Therefore, the measuring device can compare the physical amounts of a plurality of points at the same time.

In Step S1206, the network processing unit 503 outputs the physical amount data frame 707 to at least one of the network interface 501 and the network interface 502. The network interface 501 and/or the network interface 502 transmits the physical amount data frame 707 to the network.

The time adjusting unit 517 outputs the index to the frame generating unit 518 and then determines the measurement time of the previous physical amount (Step S1207). In Step S1207, the time adjusting unit 517 calculates a value I_sampling, a value N_correction, and a value I_correction using the following Expressions (5) to (7) on the basis of a converted frequency F_oscillator, which is the frequency of the crystal oscillator 515 in terms of the clock of a target protection relay (for example, the protection relay 101), and a measurement frequency F_sampling indicating the number of measurements per second, for the record of each protection relay stored in the storage unit 514:

$$I\_sampling = \text{Floor}(F\_oscillator / F\_sampling) \quad (5)$$

$$N\_correction = F\_oscillator - I\_sampling \times F\_sampling \quad (6)$$

$$I\_correction = \text{Floor}(N\_correction / I\_sampling) \quad (7)$$

A function Floor(x) returns the maximum integer which is not more than a value x.

The value I_sampling is the measurement time interval represented by the number of clocks of the crystal oscillator 515. However, the value I_sampling is represented in clock units and is obtained by omitting decimals in the function Floor( ). Therefore, the time for which the crystal oscillator 515 measures the value F_sampling at an interval of the value I_sampling several times is likely to be less than one second. Therefore, the time adjusting unit 517 sometimes corrects the measurement time interval by adding 1 to the interval. The value N_correction indicates the number of corrections per second. The value I_correction indicates the number of measurements between corrections.

Figure 8:
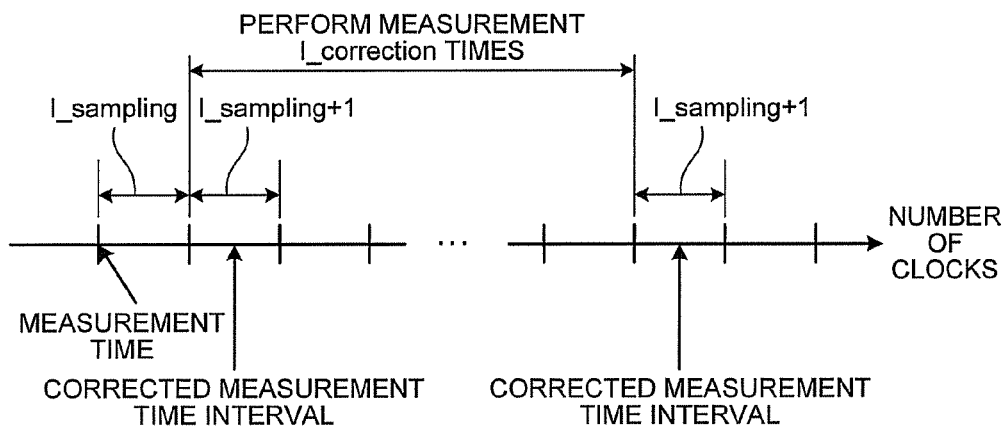
FIG. 8 is a diagram illustrating the relation between a value I_sampling and a value I_correction.

FIG. 8 shows the relation between the value I_sampling and the value I_correction. Basically, the measurement time interval is the value I_correction. However, whenever the number of measurements reaches a value indicated by the value I_correction, the measurement time interval is corrected to the value I_sampling+1.

The time adjusting unit 517 calculates C_next_sampling which indicates the number of clocks until the next measurement time for each of the devices (for example, the protection relays 101 and 130), using the value N_correction and the value I_correction. Next, the time adjusting unit 517 calculates C_next_sampling_min which indicates the smallest C_next_sampling among devices. Next, the time adjusting unit 517 calculates C_sampling which indicates the number of clocks until the next measurement time using the following Expression (8):

$$C\_sampling = C\_next\_sampling\_min - (T\_current - T\_prev\_sampling) \quad (8)$$

In Expression (8), the value T_current is the current value of the clock counter of the crystal oscillator 515. The value T_prev_sampling is the value of the clock counter of the crystal oscillator 515 at the time when the time adjusting unit 517 previously transmitted the index to the frame generating unit 518. That is, the value (T_current−T_prev_sampling) indicates the time required for the time adjusting unit 517 to perform an operation.

When the value C_sampling is less than predetermined time, the time adjusting unit 517 may integrate the next measurement time with the current measurement time.

Figure 9A:
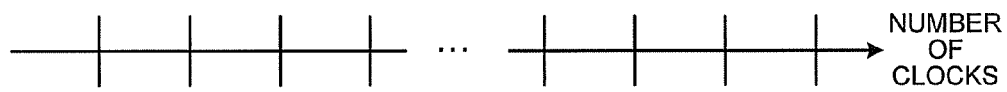
FIGS. 9A to 9C are diagrams illustrating a difference in the number of clocks until the next measurement in each device.
Figure 9B:
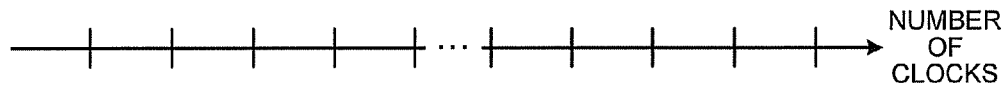

Next, a case in which the time adjusting unit 517 may integrate the measurement time will be described with reference to FIGS. 9A to 9C. FIGS. 9A and 9B show the measurement time of the physical amount transmitted to, for example, each of the protection relay 101 and the bus protection relay 130. The oscillating frequency of the crystal oscillator 1404 provided in each of the protection relay 101 and the bus protection relay 130 or the crystal oscillator 515 provided in the measuring device 104 is likely to include an error due to, for example, a variation in the ambient temperature. In addition, the physical amount measurement time intervals required for the protection relay 101 and the bus protection relay 130 are likely to be different from each other.

In this example, the measurement time interval of the protection relay 101 shown in FIG. 9A is more than that of the bus protection relay 130 shown in FIG. 9B. In FIGS. 9A and 9B, in some cases, each measurement time interval is corrected. Therefore, each measurement time interval is not necessarily constant.

Figure 9C:
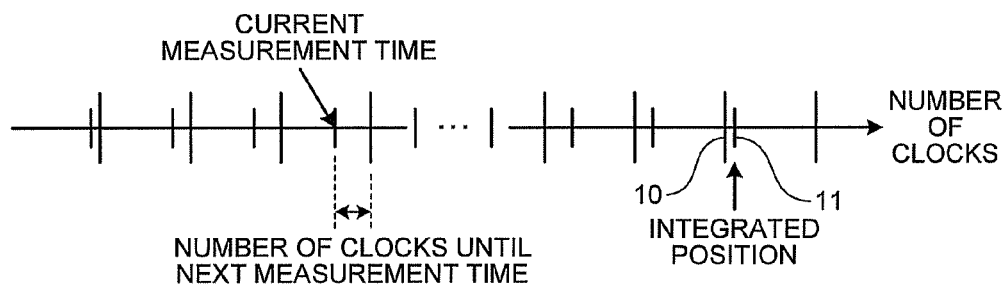

As shown in FIG. 9C, when the measurement intervals of the physical amounts transmitted to the protection relay 101 and the bus protection relay 130 are represented by the number of clocks of the crystal oscillator 515 of the measuring device 104, the measurement intervals are likely to be different from each other. As shown as an integrated position in FIG. 9C, the interval between the measurement time 10 of the protection relay 101 and the measurement time 11 of the bus protection relay 130 is likely to be very short. In a portion in which the measurement time interval is short, when the operation time of the time adjusting unit 517 is more than the measurement time interval, there is a concern that the subsequent measurement will be delayed at an adjacent measurement time.

The time adjusting unit 517 compares the next measurement time 10 calculated for the protection relay 101 with the measurement time 11 calculated for the bus protection relay 130. When the interval between the measurement time 10 and the measurement time 11 is less than a predetermined time, the index of the record of the bus protection relay 130 may be output to the frame generating unit 518 immediately after the index is output to the frame generating unit 518 at the measurement time 10.

When the measuring device according to the first embodiment is used in the system in which the destination address of the physical amount data frame 707 is set to a multi-cast address and the interval between the measurement time 10 and the measurement time 11 is less than a predetermined time, the time adjusting unit 517 may not output the index to the frame generating unit 518 at the measurement time 11. In this case, when the destination address of the physical amount data frame 707 is a multi-cast address, a plurality of devices may receive the physical amount data frame 707. In the above-mentioned example, the protection relay 101 and the bus protection relay 130 may receive the same physical amount data frame 707.

The above is the process of the measuring device 104 in Step S757.

Then, as shown in FIG. 6, the measuring device 105 transfers the physical amount data frame 707 to the protection relay 101 (Step S758). For example, it is assumed that the measuring device 105 (measuring device 500) receives the physical amount data frame 707 using the network interface 502, as shown in FIG. 3. In this case, the network interface 502 outputs the physical amount data frame 707 to the network processing unit 503. The network processing unit 503 outputs the physical amount data frame 707 to the network interface 501. The network interface 501 transmits the physical amount data frame 707 to the network.

The protection relay 101 receives the physical amount data frame 707 transmitted from the measuring device 105 (Step S759). As described above with reference to FIG. 2, the measuring device 104 and the measuring device 105 transmit the physical amount data frame to the protection relay 101 substantially at the same time. In the example shown in FIG. 6, the measuring device 105 transmits the physical amount data frame 708 in which the value of the physical amount measured by the measuring device 105 is described substantially at the same time as that when the physical amount data frame 707 in which the value of the physical amount measured by the measuring device 104 is described is transmitted. The above is the third sequence.

When receiving the physical amount data frames 707 and 708, the protection relay 101 compares the physical amounts described in the received physical amount data frames 707 and 708 and examines whether there is a problem on the basis of the comparison result. When a problem is detected, the protection relay 101 transmits a trip message to the breaker controller 119. When receiving the trip message, the breaker controller 119 outputs a trip signal to the breaker 110. When receiving the trip signal, the breaker 110 immediately discontinues the electrical flow on the transmission line 116.

As described above, according to the first embodiment, a plurality of measuring devices that transmit the physical amount data frames to the same protection relay determine the measurement time of the physical amount on the basis of the time of the same protection relay. Therefore, the measuring devices can measure the physical amounts at the same time.

According to the measuring device of the first embodiment, the time adjusting unit 517 can determine the measurement time of the physical amount transmitted to a plurality of devices, such as the protection relay 101 and the bus protection relay 130. Therefore, a time server is not required in the substation. In addition, for example, when the protection relay 101 is out of order and there is an error in the time of the protection relay 101, the measuring device 104 and the measuring device 105 can exactly determine the measurement time of the physical amount transmitted to the bus protection relay 130. Therefore, the measuring device according to the first embodiment can improve the reliability of the substation.

According to the measuring device of the first embodiment, the measuring device does not need to include a plurality of phase locked loops (PLL) in spite that the measuring device can determine the measurement time for a plurality of protection relays. As long as there is a space in the storage area of the storage unit 514, the number of protection relays, which are the destinations of the physical amount data frame, may be flexibly changed. Contrary to the structure according to the first embodiment, in the structure disclosed in U.S. Pat. No. 7,693,607 in which a PLL is provided for each protection relay, the number of protection relays supported by the measuring device is limited to the number of PLLs. Therefore, the structure disclosed in U.S. Pat. No. 7,693,607 has low flexibility.

In the typical substation, the frequency of adjustment of the measurement time is lower than that of transmission of the physical amount. Therefore, the protection relay according to the first embodiment can reduce the amount of data related to time which is transmitted or received. In addition, the measuring device according to the first embodiment may include a plurality of A/D converters to which the physical amounts are input such that it can measure a plurality of physical amounts.

The measuring device according to the first embodiment may include another storage unit for storing the value of the digitalized physical amount, instead of the A/D converter 519, such that it can measure the physical amount even when a digital physical amount signal is input. Another storage unit may overwrite a new value on the previous value stored therein whenever the value of the digitalized physical amount is input. In addition, the value of the physical amount stored in another storage unit is acquired by the frame generating unit 518.

The time calculating unit 513 of the measuring device according to the first embodiment may process the Sync message transmitted between the network interface 501 and the network interface 502. In this case, the Sync message is transmitted to the time calculating unit 513 through the network processing unit 503 and the DEMUX 506. The time calculating unit 513 calculates the estimated transmission processing time and describes the value of the transmission processing time in the Sync message. Then, the time calculating unit 513 transmits the Sync message from a send queue (not shown) to the network processing unit 503 through the MUX 505.

The network processing unit 503 outputs the transmitted Sync message from a network interface different from the network interface that receives the Sync message. The entire process for the Sync message is integrated into the time calculating unit 513. In this way, it is possible to reduce the size of a circuit. The measuring device 105 may measure a communication delay between the measuring device 105 and the measuring device 104. In this way, even though the Sync message is transmitted in any direction of the network on the ring, it is possible to describe the communication delay between the network interface which receives the Sync message and an adjacent device which is connected to the network interface in the Correction field of the Sync message.

First Modification of First Embodiment

Figure 10:
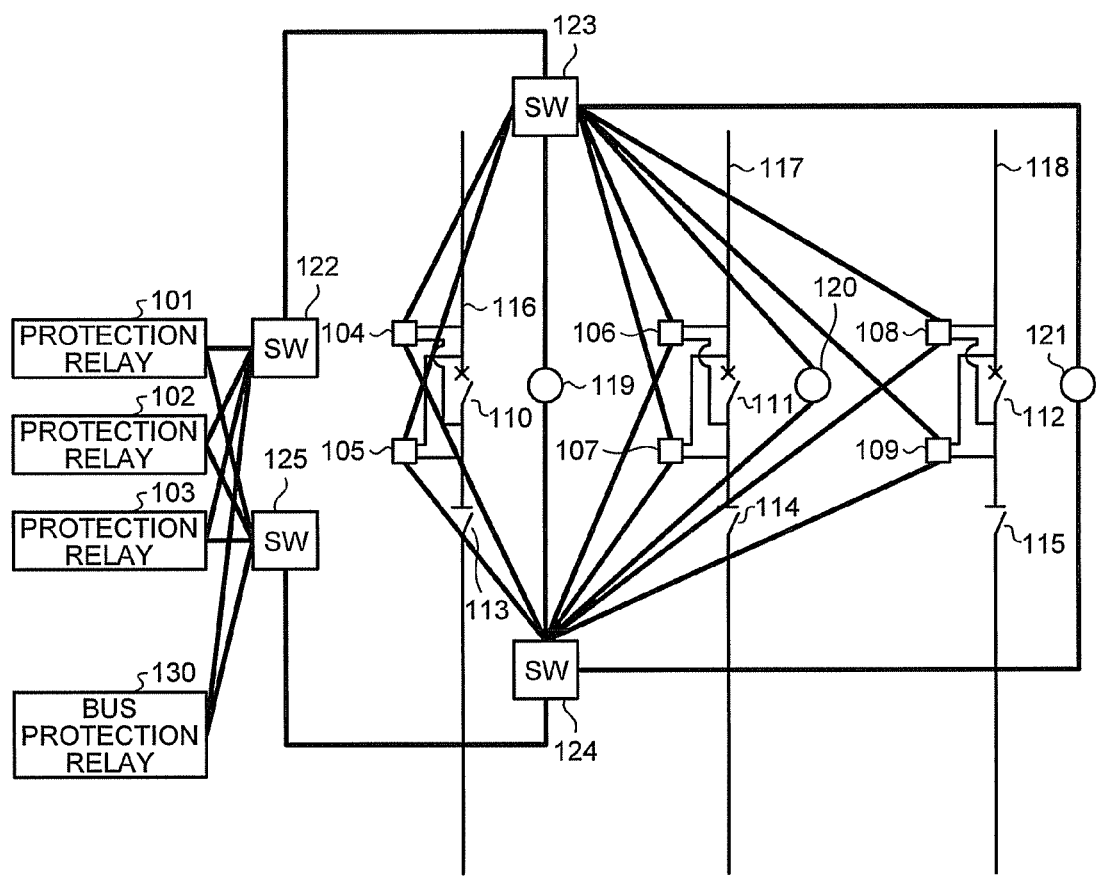
FIG. 10 is a diagram illustrating a transmission line protection system according to a first modification of the first embodiment.

Next, a first modification of the first embodiment will be described. As shown in FIG. 10, the transmission line protection system according to the first embodiment may be constructed using a double star network. In FIG. 10, the same components as those shown in FIG. 1 are denoted by the same reference numerals and a detailed description thereof will not be repeated.

According to the structure shown in FIG. 10, each of the protection relays 101 to 103, the measuring devices 104 to 109, the breaker controllers 119 to 121, and the bus protection relay 130 includes two communication ports (for example, the network interfaces 501 and 502 and the network interfaces 1401 and 1402) and is connected to two redundant star networks, that is, a star network shown on the upper side of FIG. 10 and a star network shown on the lower side of FIG. 10. In the star network shown on the upper side of FIG. 10, the protection relays 101 to 103 and the bus protection relay 130 are connected to a switch (SW) 122. Similarly, the measuring devices 104 to 109 and the breaker controllers 119 to 121 are connected to a switch 123. In the star network shown on the lower side of FIG. 10, the devices are connected to switches 124 and 125 in the same way.

In the structure shown in FIG. 10, each of the protection relays 101 to 103, the measuring devices 104 to 109, the breaker controllers 119 to 121, and the bus protection relay 130 does not transmit a received frame to other devices when the destination address of the received frame is a multi-cast address or when the destination address is not its own address. The measuring devices 104 to 109 acquire a physical amount from, for example, a current transformer (not shown) and a voltage measuring transformer (not shown) which is connected to the transmission line, digitalize the value of the physical amount, and transmit the value to any one of the protection relays 101 to 103 and the bus protection relay 130.

The other operations are the same as those in the first embodiment described with reference to FIG. 1 and thus a detailed description thereof will not be repeated.

Second Modification of First Embodiment

Figure 11:
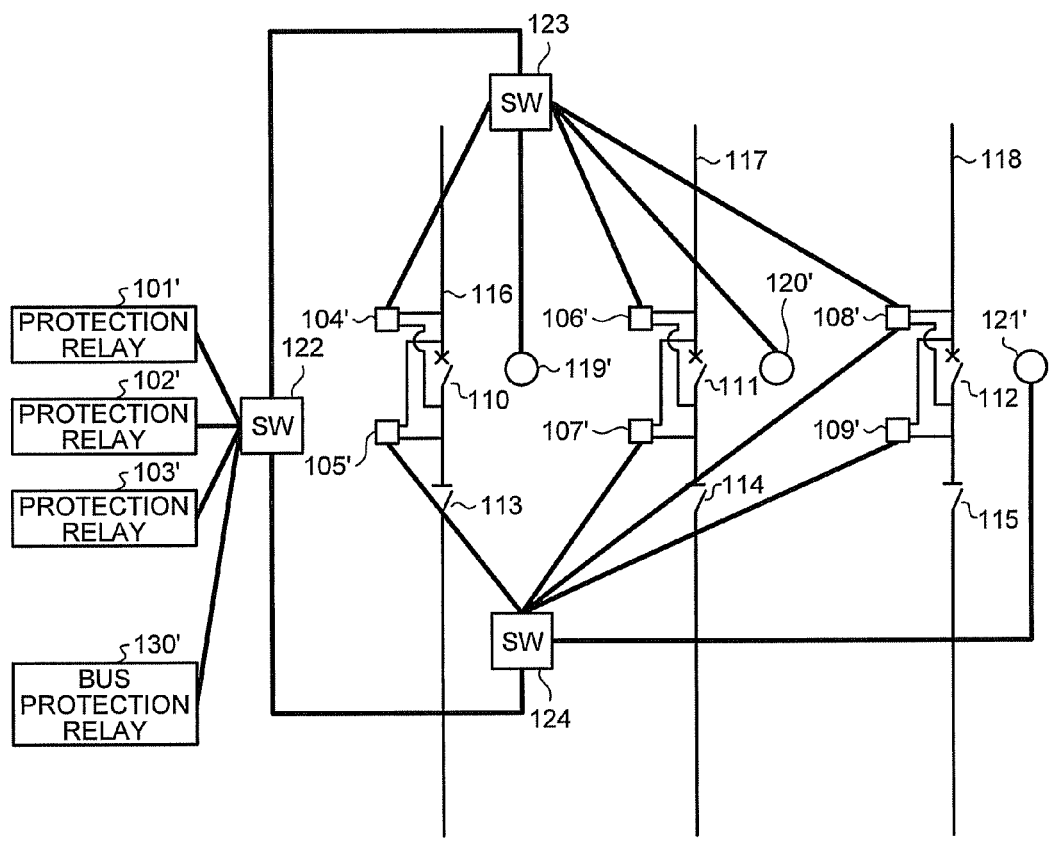
FIG. 11 is a diagram illustrating a transmission line protection system according to a second modification of the first embodiment.

Next, a second modification of the first embodiment will be described. As shown in FIG. 11, redundancy may not be provided in the structure shown in FIG. 10. That is, the transmission line protection system according to the first embodiment may be constructed using a single star network. In FIG. 11, the same components as those shown in FIGS. 1 and 10 are denoted by the same reference numerals and a detailed description thereof will not be repeated.

According to the structure shown in FIG. 11, each of protection relays 101' to 103', measuring devices 104' to 109', breaker controllers 119' to 121', and a bus protection relay 130' may include one communication port. A method of transmitting a message or a data frame is the same as that in the first modification and a detailed description thereof will not be repeated.

Third Modification of First Embodiment

Figure 12:
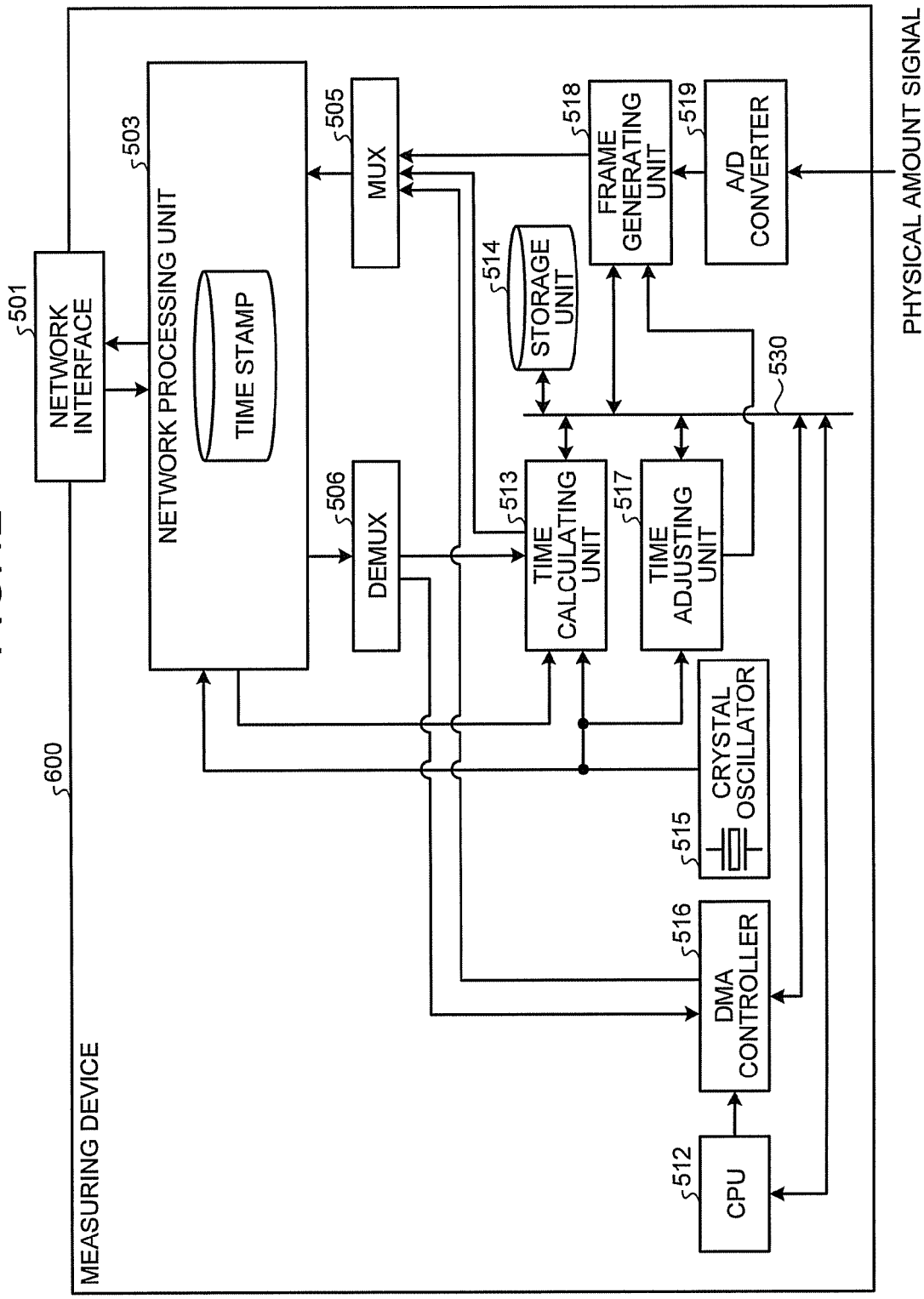
FIG. 12 is a diagram illustrating the structure of a measuring device according to a third modification of the first embodiment.

Next, a third modification of the first embodiment will be described. A measuring device 600 shown in FIG. 12 is different from the measuring device 500 according to the first embodiment described with reference to FIG. 3 in that the network interface 502 is not provided and only one network interface is provided. In FIG. 12, the same components as those shown in FIG. 3 are denoted by the same reference numerals and a detailed description thereof will not be repeated.

The measuring device 600 differs from the measuring device 500 shown in FIG. 3 in that it outputs the frame received by the network interface 501 to the DEMUX 506 and outputs the frame input to the MUX 505 to the network interface 501. When the destination address of the received frame is a multi-cast address, the measuring device 600 does not transmit the frame.

The measuring device 600 according to the third modification may be used as the measuring devices 104' to 109' in the transmission line protection system which is constructed by the single star network according to the second modification described with reference to FIG. 11.

Fourth Modification of First Embodiment

Figure 13A:
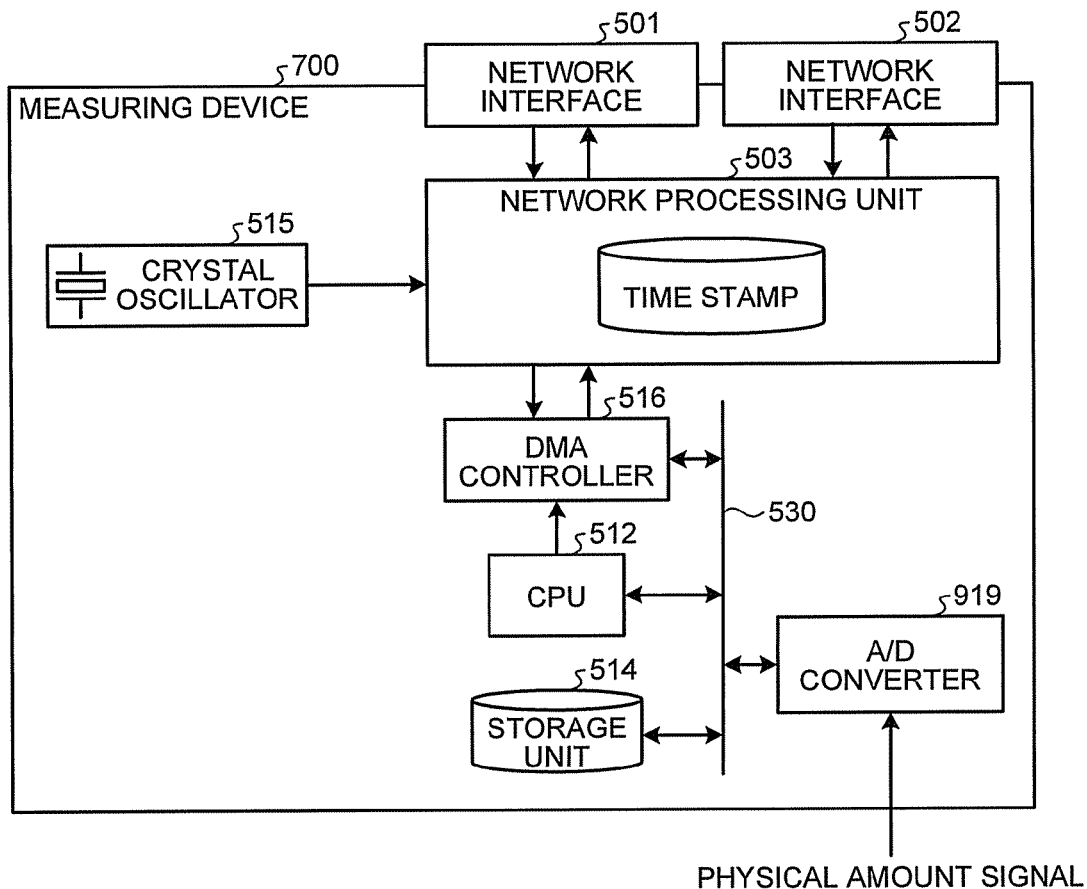
FIG. 13A is a diagram illustrating the structure of a measuring device according to a fourth modification of the first embodiment.
Figure 13B:
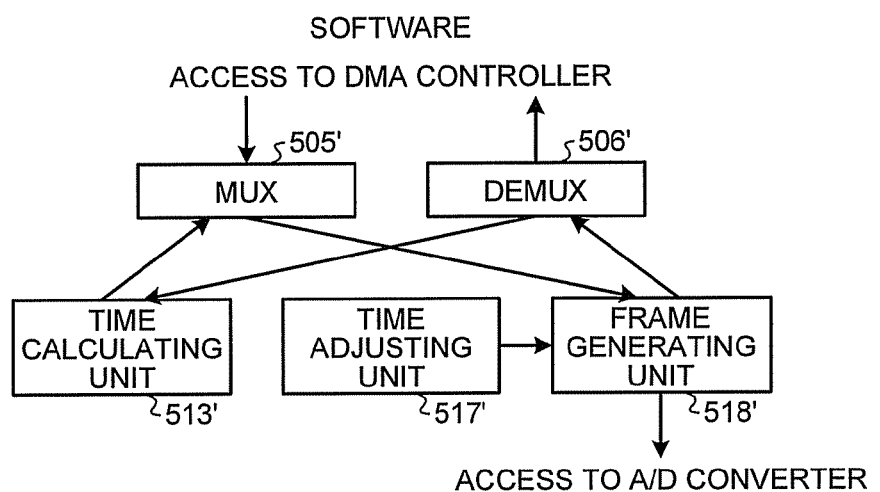
FIG. 13B is a diagram illustrating the structure of the measuring device according to the fourth modification of the first embodiment.

Next, a fourth modification of the first embodiment will be described. A measuring device 700 shown in FIG. 13A is an example in which some units of the measuring device 500 according to the first embodiment described with reference to FIG. 3 are implemented by software which is operated on the CPU 512. In FIGS. 13A and 13B, the same components as those shown in FIG. 3 are denoted by the same reference numerals and a detailed description thereof will not be repeated.

In this example, as shown in FIG. 13A, the measuring device 700 includes hardware network interfaces 501 and 502, a network processing unit 503, a CPU 512, a storage unit 514, a crystal oscillator 515, a DMA controller 516, an A/D converter 519, and a bus 530. The CPU 512, the storage unit 514, the DMA controller 516, and the A/D converter 519 are connected to the bus 530 such that they can communicate with each other.

As shown in FIG. 13B, in the measuring device 700, a MUX 505', a DEMUX 506', a time calculating unit 513', a time adjusting unit 517', and a frame generating unit 518' are implemented as software which is operated on an operating system (OS) (not shown) executed on the CPU 512. The MUX 505', the DEMUX 506', the time calculating unit 513', the time adjusting unit 517', and the frame generating unit 518' are implemented as modules of the software that is operated on the CPU 512 and implements the same functions as those of the MUX 505, the DEMUX 506, the time calculating unit 513, the time adjusting unit 517, and the frame generating unit 518, respectively, which are hardware components shown in FIG. 3.

The MUX 505' and the DEMUX 506' access the DMA controller 516 and transmit various kinds of frames. The frame generating unit 518' accesses the A/D converter 519 and acquires digital data of the measured physical amount.

For example, a program for forming the MUX 505', the DEMUX 506', the time calculating unit 513', the time adjusting unit 517', and the frame generating unit 518' is stored in the storage unit 514. When the measuring device 700 starts, the CPU 512 reads a program from a ROM and executes the program. Then, each module is expanded on a RAM (not shown) and the MUX 505', the DEMUX 506', the time calculating unit 513', the time adjusting unit 517', and the frame generating unit 518' are formed on the RAM.

For example, the program executed by the measuring device 700 according to the fourth modification is stored in the storage unit 514 in advance and is then provided. However, the embodiment is not limited thereto. The program may be provided to the measuring device 700 through the network. In this case, for example, a frame including the program is received by the network interface 501 or 502 and is then stored in the storage unit 514 through the network processing unit 503 and the DMA controller 516.

However, the embodiment is not limited thereto. The program may be recorded as a file of an installable format or an executable format on a computer-readable recording medium, such as a compact disk (CD), a flexible disk (FD), or a digital versatile disk (DVD) and then provided. In this case, a drive device that can read the recording medium is connected to the bus 530. Then, the recording medium having the program recorded thereon is inserted into the drive device and the program is read from the recording medium and is then stored in the storage unit 514.

As described above, when some functions of the measuring device 700 are implemented by software operated on the CPU 512, it is possible to reduce the size of a circuit, as compared to the measuring device 500 in which all units are hardware components. In addition, the measuring device 700 according to the fourth modification can perform the adjustment of the measurement time and the transmission of the physical amount at different times. This is the same as that in the measuring device 500 according to the first embodiment and the measuring device 600 according to the third modification.

The measuring device 700 according to the fourth modification may not include the network interface 502 and may include only one network interface 501, similarly to the measuring device 600 according to the third modification.

Second Embodiment

A measuring device according to a second embodiment periodically measures a physical amount according to a crystal oscillator provided in the measuring device and transmits a frame (physical amount data frame) having the value of the physical amount described therein to a protection relay and a bus protection relay. In the second embodiment, the measurement time is not adjusted according to the time of the protection relay, unlike the measuring device according to the first embodiment. Therefore, the physical amounts transmitted from a plurality of measuring devices to the same protection relay may not be measured at the same time.

In the second embodiment, the measuring device periodically transmits a frame (hereinafter, referred to as a Sync message B) having the time of the measuring device described therein to the protection relay and the bus protection relay. In addition, the measuring device describes the measurement time of the physical amount in the physical amount data frame. The protection relay and the bus protection relay according to the second embodiment calculates the time difference between the protection relay and each of the measuring devices where the measuring devices are the sources of the physical amount data frames, using the time described in the Sync message B which is received from each measuring device. In addition, each of the protection relays and the bus protection relays converts the measurement time of the physical amount described in the physical amount data frame into its own time.

In this way, the protection relay and the bus protection relay according to the second embodiment know the relation between the times when a plurality of measuring devices measures the physical amount. For example, two measuring devices A and B that transmit the physical amount data frame to one protection relay are considered. In this case, as shown in FIG. 14, it is considered that the measurement times $t_1, t_2, \ldots$ of the measuring device A are different from the measurement times $t'_1, t'_2, \ldots$ of the measuring device B.

The protection relay receives the physical amount data frames in which the values of the physical amounts measured by the measuring device A and the measuring device B at different times are described from the measuring device A and the measuring device B. The protection relay may convert the measurement times t1, t2, . . . of the measuring device A and the measurement times t'1, t'2, . . . of the measuring device B to the times of the protection relay, thereby knowing the relation between the measurement times of the measuring device A and the measurement times of the measuring device B. The protection relay may compare time-series data items obtained by the values of the physical amounts measured by the measuring device A and the measuring device B to verify whether there is a problem, such as an overcurrent.

Next, a transmission line protection system according to the second embodiment will be described in detail. The structure of the system according to the first embodiment described with reference to FIGS. 1, 10, and 11 can be applied to the second embodiment without any change and thus a description thereof will not be repeated. An example in which the ring-type network shown in FIG. 1 is applied to the second embodiment will be described below. That is, the transmission line protection system according to the second embodiment includes protection relays 101 to 103, measuring devices 104 to 109, breakers 110 to 112, switches 113 to 115, transmission lines 116 to 118, a bus protection relay 130, and breaker controllers 119 to 121. The protection relays 101 to 103, the measuring devices 104 to 109, the bus protection relay 130, and the breaker controllers 119 to 121 form a ring-type network.

The measuring devices 104 to 109 according to the second embodiment transmits the physical amount data frame to the protection relays 101 to 103 and the bus protection relay 130 through the network according to, for example, the relation shown in FIG. 2. In addition, unlike the first embodiment, the measuring devices 104 to 109 according to the second embodiment transmits the Sync message B having time described therein to the protection relays 101 to 103 and the bus protection relay 130 through the network according to, for example, the relation shown in FIG. 2. In the second embodiment, unlike the first embodiment, the protection relays 101 to 103 and the bus protection relay 130 may not transmit the Sync message having time described therein to the measuring devices 104 to 109.

The time interval at which the measuring devices 104 to 109 transmit the physical amount data frame may be a constant value based on a crystal oscillator provided in each measuring device or it may be variable. However, the measuring devices 104 to 109 sufficiently frequently measure the physical amount and transmit the physical amount data frame to the protection relay such that the protection relay, which is a transmission destination, can sufficiently know a variation in the physical amount. In addition, the time interval at which the measuring devices 104 to 109 transmit the Sync message B may be a constant value based on the crystal oscillator provided in each measuring device, or it may be variable.

When the second embodiment is applied to a typical substation, the measuring device periodically transmits its own time in a multi-cast manner. However, the embodiment is not limited thereto. For example, the measuring devices 104 to 109 may periodically transmit their own time to the protection relay or the bus protection relay having the relation shown in FIG. 2 in a unicast manner.

The correspondence relation among the protection relays 101 to 103, the measuring devices 104 to 109, and the bus protection relay 130 is not limited to that shown in FIG. 2, but the protection relays 101 to 103, the measuring devices 104 to 109, and the bus protection relay 130 may be combined with each other in other ways. In particular, each of the measuring devices 104 to 109 may transmit the physical amount data frame to different numbers of protection relays. In this case, in the second embodiment, each of the measuring devices 104 to 109 transmits the Sync message B to at least the protection relays 101 to 103 or the bus protection relay 130, which is the destination of the physical amount data frame.

In the second embodiment, the method of acquiring the time of the measuring devices 104 to 109 by the protection relays 101 to 103 and the bus protection relay 130 is not particularly limited. For example, the protection relays 101 to 103, the measuring devices 104 to 109, and the bus protection relay 130 may have functions based on IEEE 1588 or NTP. In the second embodiment, an example in which the protection relays 101 to 103, the measuring devices 104 to 109, and the bus protection relay 130 are based on a one-step mode of IEEE 1588 and a system called a peer delay mechanism will be described.

That is, when the protection relays 101 to 103, the measuring devices 104 to 109, and the bus protection relay 130 transmit or transfer the Sync message B, the estimated time required for the transferring process is described in the Sync message B. In addition, each of the protection relays 101 to 103, the measuring devices 104 to 109, and the bus protection relay 130 has a function of transmitting a Pdelay_Req message to an adjacent device, a function of receiving the Pdelay_Req message from an adjacent device, a function of returning the Pdelay_Response message, and a function of receiving the Pdelay_Response message and calculating the transmission delay time of the cable connected to an adjacent device.

Information indicating the time when the Pdelay_Req message is transmitted is described in the Pdelay_Req message. In addition, information indicating the time when the Pdelay_Req message is received and the time when the Pdelay_Response message is transmitted is described in the Pdelay_Response message.

In the second embodiment, the operations of the components are the same as those in the first embodiment except for the operation of the protection relays 101 to 103, the measuring devices 104 to 109, and the bus protection relay 130 shown in FIG. 1 and thus a detailed description thereof will not be repeated.

Figure 15:
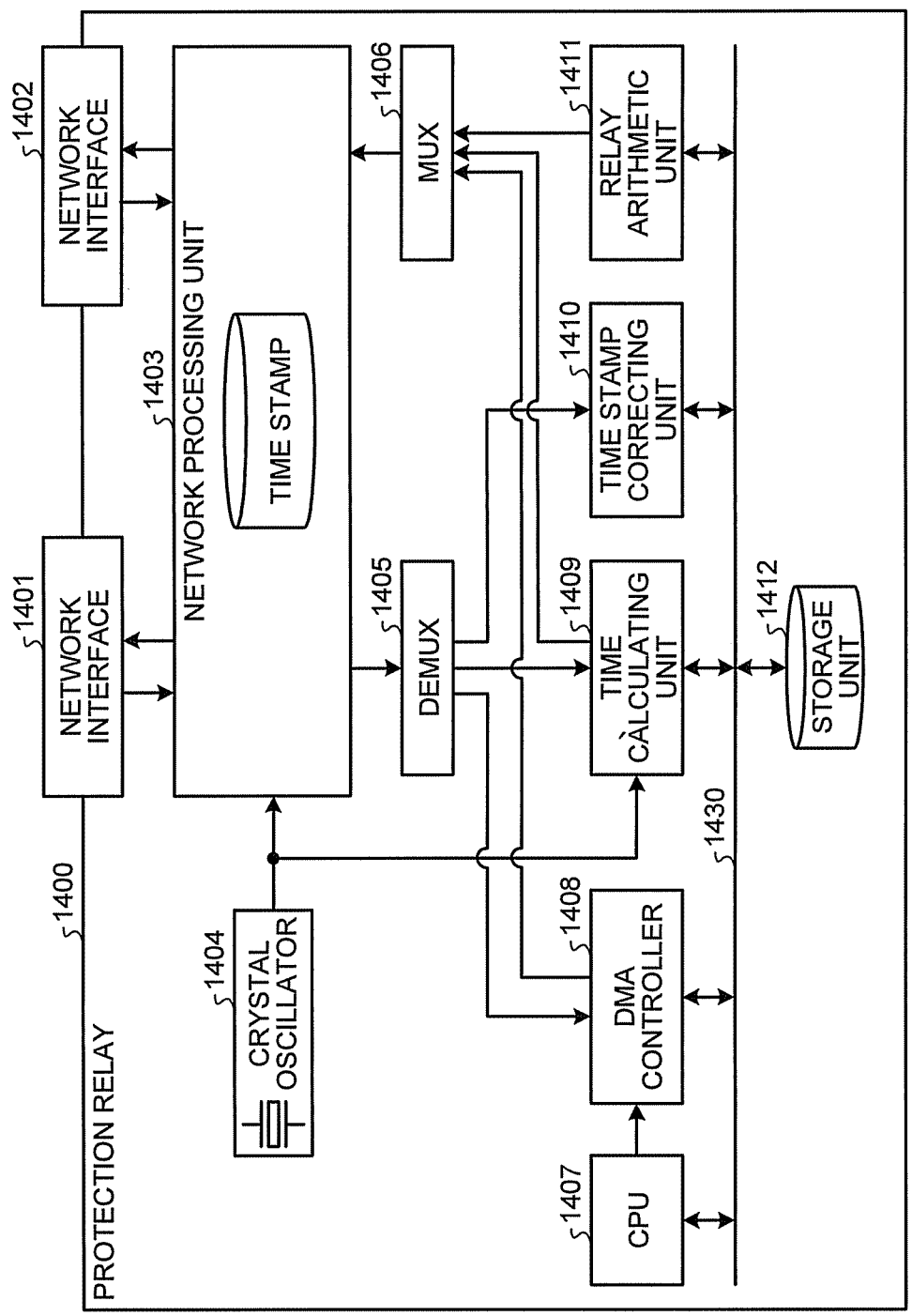
FIG. 15 is a block diagram illustrating the structure of a protection relay according to a second embodiment.

In FIG. 15, a protection relay 1400 corresponds to, for example, the protection relays 101 to 103 and the bus protection relay 130 shown in FIG. 1. The protection relay 1400 according to the second embodiment includes network interfaces 1401 and 1402, a network processing unit 1403, a MUX 1406, a DEMUX 1405, a CPU 1407, a time calculating unit 1409, a storage unit 1412, a DMA controller 1408, a crystal oscillator 1404, a time stamp correcting unit 1410, and a relay arithmetic unit 1411.

The CPU 1407 is, for example, a general-purpose processor and controls the overall operation of the protection relay 1400 using a RAM (not shown) as a work memory, according to programs stored in the storage unit 1412. The bus 1430 connects the CPU 1407, the time calculating unit 1409, the storage unit 1412, the DMA controller 1408, the time stamp correcting unit 1410, and the relay arithmetic unit 1411 so as to communicate with each other.

The operations of the network interfaces 1401 and 1402, the network processing unit 1403, the crystal oscillator 1404, the CPU 1407, and the DMA controller 1408 shown in FIG. 15 are the same as those of, for example, the network interfaces 501 and 502, the network processing unit 503, the crystal oscillator 515, the CPU 512, and the DMA controller 516 of the measuring device 500 shown in FIG. 3 and thus a detailed description thereof will not be repeated.

The DEMUX 1405 transmits the Sync message B output from the network processing unit 1403 to the time calculating unit 1409. The DEMUX 1405 also transmits the physical amount data frame output from the network processing unit 1403 to the time stamp correcting unit 1410. In addition, the DEMUX 1405 transmits other messages output from the network processing unit 1403 to the DMA controller 1408. However, the embodiment is not limited thereto. For example, the DEMUX 1405 may also output at least one of the Sync message B and the physical amount data frame to the DMA controller 1408.

The MUX 1406 acquires a frame from any one of the DMA controller 1408, the time calculating unit 1409, and the relay arithmetic unit 1411 and transmits the frame to the network processing unit 503. The time calculating unit 1409 calculates the time of the clock of the measuring device, which is the transmission source of the Sync message B, using the transmission time of the Sync message B described in the input Sync message B. In addition, the time calculating unit 1409 stores parameters (hereinafter, referred to as conversion parameters B) for converting the time of the measuring device to the time of the protection relay 1400 in the storage unit 1412.

The time stamp correcting unit 1410 converts the measurement time described in the physical amount data frame which is received from the measuring device into the time of the protection relay 1400.

The relay arithmetic unit 1411 verifies a problem in the transmission line on the basis of the time-series data of the physical amount stored in the storage unit 1412, the physical amount which is described in the latest physical amount data frame received from the measuring device, and the time of the protection relay 1400 converted from the measurement time of the physical amount. The storage unit 1412 stores the address of each measuring device, which is a transmission destination, the conversion parameters B, and the time-series data of the physical amount.

FIGS. 16 and 17 show an example of data stored in the storage unit 1412. FIG. 16 shows an example of data required to convert the time of the measuring device into the time of the protection relay 1400. The data is stored as a table including a record of each measuring device in the storage unit 1412. Each record is identified by an index. The protection relay 1400 uses the address of the measuring device to access the measuring device. For example, the MAC address of Ethernet (registered trademark) or an IP address may be used as the address of the measuring device.

The conversion parameters B include, for example, a clock rate, the time of the measuring device when the Sync message B is received, and the time of the protection relay 1400 when the Sync message B is received. The clock rate indicates the difference between the rate of progression of the time of the protection relay 1400 and the rate of progression of the time of the measuring device. That is, it is possible to know the difference between one second defined by the value of the clock counter output from the crystal oscillator 1404 of the protection relay 1400 and one second defined by the clock which measures time in the measuring device.

For example, a clock rate C_rate is obtained by calculating the ratio of the length Second_r of one second in the protection relay 1400 to the length Second_m of one second in the measuring device, which is the transmission source of the Sync message B, and adjusting the scale and is calculated by the following Expression (9):

$$C\_rate = Second\_r / Second\_m \times scale \quad (9)$$

The value "scale" is a predetermined value and is used to adjust the scale of the clock rate C_rate, thereby facilitating calculation in an adjustment operation.

FIG. 17 shows an example of the time-series data of the physical amount. The measurement time converted to the time of the protection relay 1400 and the value of the physical amount measured at the measurement time are stored so as to be associated with each other. For example, the time-series data is stored for each of the measuring devices A and B that transmit the physical amount data frame to the protection relay 1400.

Figure 18:
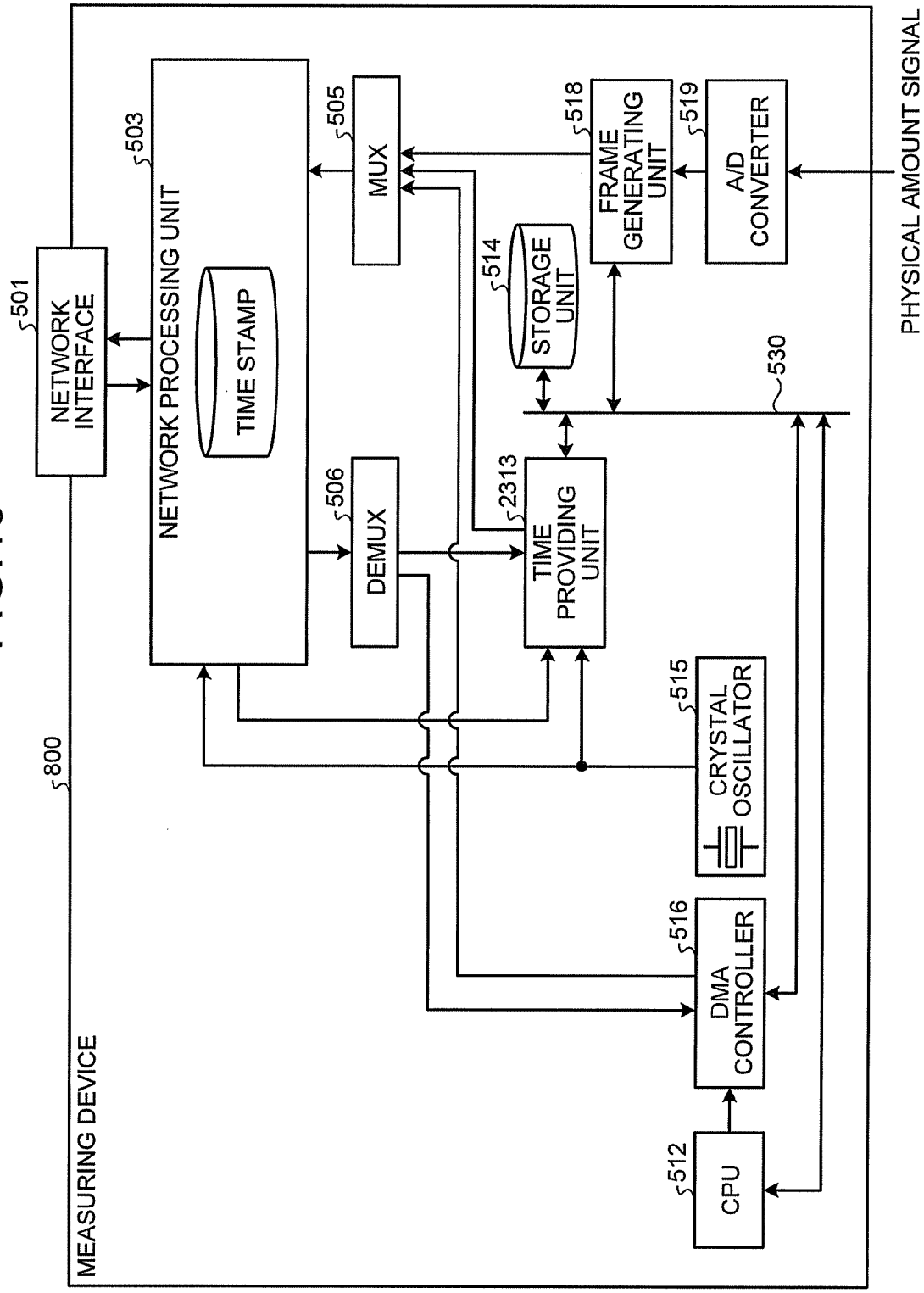
FIG. 18 is a diagram illustrating the structure of a measuring device to which the second embodiment can be applied.

FIG. 18 shows an example of the structure of a measuring device 800 applicable to the second embodiment. In FIG. 18, the same components as those in the measuring device 500 shown in FIG. 3 are denoted by the same reference numerals and a detailed description thereof will not be repeated. Hereinafter, in FIG. 18, only structures different from those shown in FIG. 3 will be described. The measuring device 800 shown in FIG. 18 corresponds to the measuring devices 104 to 109 shown in FIG. 1.

The measuring device 800 shown in FIG. 18 is different from the measuring device 500 shown in FIG. 3 in that the time calculating unit 513 and the time adjusting unit 517 are removed and a time providing unit 2313 is provided. The time providing unit 2313 periodically generates the Sync message B on the basis of the value of the clock counter output from the crystal oscillator 515. The generated Sync message B is transmitted to the network processing unit 503 through the MUX 505 and is then transmitted by the network interface 501.

In addition, the time providing unit 2313 generates a Pdeley_Req message and a Pdeley_Response message. The generated Pdeley_Req message and Pdeley_Response message are transmitted to the network processing unit 503 through the MUX 505 and are then transmitted by the network interface 501 or 502. The time providing unit 2313 processes the Pdeley_Req message and the Pdeley_Response message which are received by the network interface 501 or 502 and are then transmitted through the network processing unit 503 and the DEMUX 506.

Figure 19:
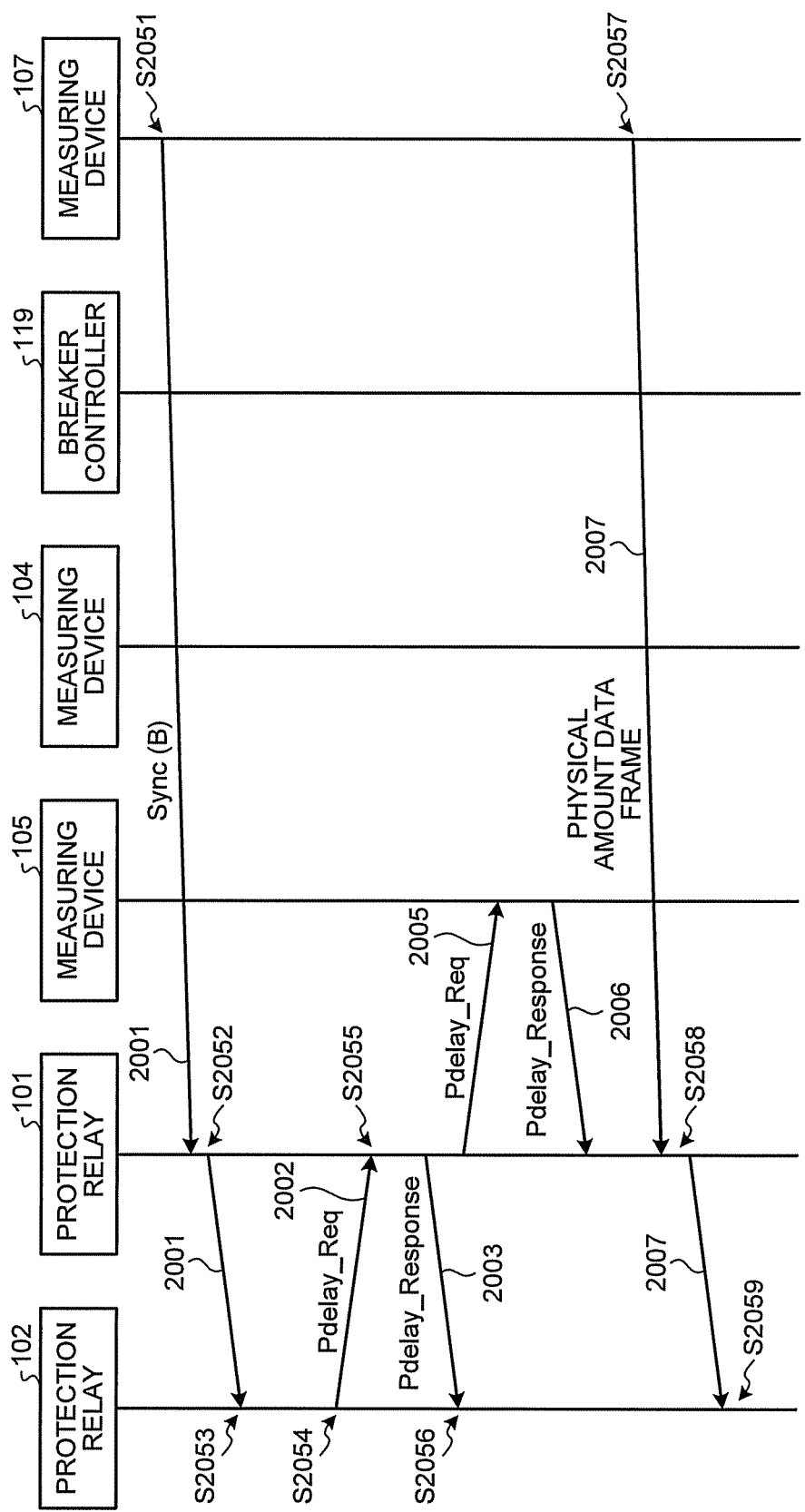
FIG. 19 is a sequence diagram illustrating a process of transmitting a physical amount data frame.

Next, the process of the protection relay according to the second embodiment will be described. FIG. 19 is a sequence diagram illustrating an example of a process when the measuring device 107 transmits a physical amount data frame to the protection relay 102. Referring to FIG. 1, the physical amount data frame output from the measuring device 107 is transmitted to the protection relay 101 through the measuring devices 104 and 105 and is then transferred from the protection relay 101 to the protection relay 102. The process of the measuring devices 104 and 105 is the same as that of the measuring device 105 and a description thereof will not be repeated.

The sequence shown in FIG. 19 is classified into three sequences, that is, first to third sequences. In the first sequence, the protection relay 102 receives the Sync message B transmitted from the measuring device 107 and calculates the time of the measuring device 107. In the second sequence, the protection relay 102 periodically measures a communication delay on the network between the protection relay 102 and an adjacent device. In the third sequence, the measuring device 107 transmits the physical amount data frame to the protection relay 102.

The first to third sequences may be performed at different times, or the first to third sequences may be performed in any order. In the second embodiment, the second sequence is not necessarily performed. Since the second sequence is performed in order to measure the transmission delay time of the Sync message B with high accuracy, the second sequence makes it possible for the protection relay to calculate the time of the measuring device with high accuracy. When high-accuracy measurement is not needed, the second sequence may not be performed.

First, the first sequence will be described. The measuring device 107 transmits a Sync message B2001 (Step S2051). The destination address of the Sync message B2001 is the address of the protection relay 102 or a multi-cast address. The Sync message B2001 is transferred by the breaker controller 119, the measuring device 104, and the measuring device 105 (not shown) and is then received by the protection relay 101.

When transferring the Sync message B2001, the breaker controller 119, the measuring device 104, and the measuring device 105 may replace the value of the Correction field included in the Sync message B2001 with a value D_new_correction calculated by the following Expression (10):

$$D\_new\_correctio = D\_trans + D\_old\_correction + D\_pde\text{-}lay \quad (10)$$

In Expression (10), the value D_trans indicates the processing time of the Sync message B2001. The value D_old_ correction indicates the original value written in the Correction field of the Sync message B2001. The value D_pdelay indicates the communication delay between the network interface which receives the Sync message B2001 and an adjacent device which is connected to the measuring device by the cable.

In Step S2052, the protection relay 101 transfers the Sync message B2001 to the protection relay 102. The process of the protection relay 101 in Step S2052 is the same as the process of the measuring device 105 according to the first embodiment which is described in Step S752 of FIG. 6. In Step S2052, the protection relay 101 may calculate the value D_new_correction and describe the value in the Correction field.

The protection relay 102 receives the Sync message B2001 transferred from the protection relay 101 (Step S2053). Then, the protection relay 101 calculates the time of the measuring device 107 and the clock rate from the received Sync message B2001.

The operation of the protection relay 102 in Step S2053 will be described below with reference to FIG. 15. It is assumed that the network interface 1401 receives the Sync message B2001 in the protection relay 102 (protection relay 1400). The network interface 1401 outputs the Sync message B2001 to the network processing unit 1403. The network processing unit 1403 acquires the value of the clock counter output from the crystal oscillator 1404 as a time stamp.

Since the destination address of the Sync message B2001 is the address of the protection relay 1400 or a multi-cast address, the network processing unit 1403 outputs the Sync message B2001 to the DEMUX 1405. When the destination address of the Sync message B2001 is a multi-cast address, the network processing unit 1403 also outputs the Sync message B2001 to the network interface 1402. The subsequent process is the same as that in the Step S752 shown in FIG. 6 and thus a description thereof will not be repeated.

Then, the DEMUX 1405 determines the output destination of the Sync message B2001. When an input frame is the Sync message B, the Pdelay_Req message, or the Pdelay_Response message, the DEMUX 1405 outputs the frame to the time calculating unit 1409. When the input frame is a physical amount data frame, the DEMUX 1405 outputs the frame to the time stamp correcting unit 1410 and outputs all of the other frames to the DMA controller 1408. In this embodiment, since the frame of the Sync message B2001 is input, the DEMUX 1405 outputs the input Sync message B2001 to the time calculating unit 1409.

The time calculating unit 1409 acquires the value of the clock counter indicating the time when the Sync message B2001 is received, from the network processing unit 1403. Then, the time calculating unit 1409 calculates a clock rate on the basis of the transmission time T_sync_send of the Sync message B2001 described in the Sync message B2001, a clock counter value C_sync_recv when the Sync message B2001 is received, the communication delay D_sync of the Sync message B2001, and the time of the measuring device when the previous Sync message B is received and the time of the protection relay 102 which are stored in the storage unit 1412.

The communication delay D_sync may be a predetermined value. The communication delay D_sync may be the value written in the Correction field of the Sync message B2001. The communication delay D_sync may be the sum of the value written in the Correction field of the Sync message B2001 and the communication delay between the protection relay 102 and the protection relay 101 measured in the second sequence, which will be described below.

The time calculating unit 1409 may calculate the clock rate using, for example, a PI control method, a recurrence analysis method, or a linear programming method. In addition, the time calculating unit 1409 may store the time of the measuring device and the time of the protection relay 1400 when one or more Sync messages B are received before the reception of the previous Sync message B in the storage unit 1412. The time calculating unit 1409 may calculate the clock rate using the time of the measuring device and the time of the protection relay 1400 when the previous Sync message B is received and the time of one or more measuring devices and protection relays 1400 stored in the storage unit 1412. In this way, for example, when the recurrence analysis method or the linear programming method is used, it is possible to estimate the clock rate with high accuracy.

The time calculating unit 1409 stores the calculated clock rate in the storage unit 1412 (see FIG. 16). In addition, the time calculating unit 1409 calculates the time T_sync_est_recv of the measuring device 107 when the Sync message B2001 is received using the following Expression (11) and stores it in the storage unit 1412 (see FIG. 16):

$$T\_sync\_est\_recv = T\_sync\_send + D\_sync \quad (11)$$

The time calculating unit 1409 calculates the time T_sync_recv_r of the protection relay 1400 when the Sync message B2001 is received using the following Expression (12) and stores the time in the storage unit 1412 (see FIG. 16):

$$T\_sync\_recv\_r = T\_origin + C\_sync\_recv \times f \quad (12)$$

The value T_origin is the value T_sync_recv_r which is calculated when the previous Sync message B is received from the measuring device 107. However, when the Sync message B2001 is the Sync message B which is received first from the protection relay 107, the T_origin is the time of the protection relay when the value of the clock counter is "0." The above is the process of the protection relay 102 in Step S2053.

Next, the second sequence will be described. In the second sequence, the delay between adjacent devices is measured. The protection relay 102 periodically transmits the Pdelay_Req message to the adjacent protection relay 101 and receives the Pdelay_Response message from the protection relay 101.

In FIG. 19, a Pdelay_Req message 2002 is transmitted from the protection relay 102 to the protection relay 101 in Step S2054. In Step S2055, the protection relay 101 returns a Pdelay_Req message 2003 in response to the Pdelay_Req message 2002. In Step S2056, the protection relay 102 receives the Pdelay_Req message 2003. The processes in Steps S2054 to S2056 are the same as those in Steps S754 to S756 shown in FIG. 6 in the first embodiment and thus a detailed description thereof will not be repeated. The measurement of the delay between adjacent devices may be performed between any adjacent devices.

Next, the third sequence will be described. In the third sequence, the protection relay 102 receives a physical amount data frame from the measuring device 107. First, the measuring device 107 transmits a physical amount data frame 2007 (Step S2057). The physical amount data frame is transferred by the breaker controller 119, the measuring device 104, and the measuring device 105 and is then received by the protection relay 101. The protection relay 101 transfers the received physical amount data frame 2007 to the protection relay 102 (Step S2058). The process of the protection relay 101 in Step S2058 is the same as that of the measuring device 105 in Step S758 of FIG. 6 in the first embodiment and thus a detailed description thereof will not be repeated.

In Step S2059, the protection relay 102 receives the physical amount data frame 2007 and verifies whether there is a problem in the transmission line 117. The operation of the protection relay 102 in Step S2059 will be described below with reference to FIGS. 15 and 20.

Figure 20:
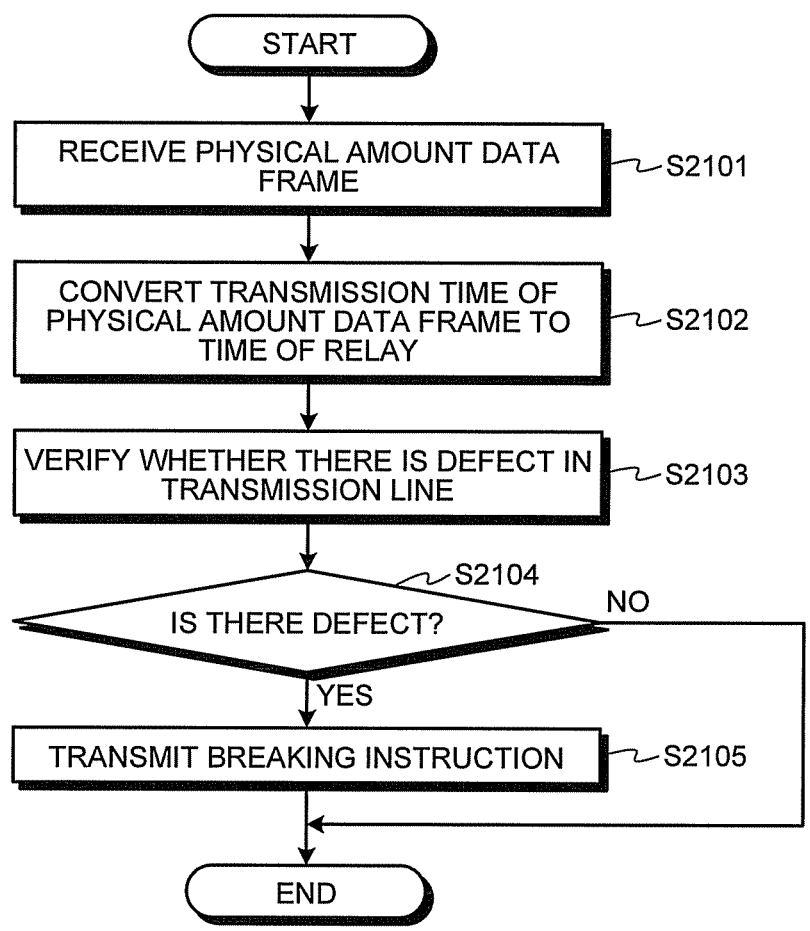
FIG. 20 is a flowchart illustrating a process of verifying whether there is a problem in a transmission line on the basis of the physical amount data frame.

First, as shown in FIG. 20, the protection relay 102 (protection relay 1400) receives the physical amount data frame 2007 (Step S2101). It is assumed that the network interface 1401 receives the physical amount data frame 2007. The network interface 1401 outputs the received physical amount data frame 2007 to the network processing unit 1403. The destination address of the physical amount data frame 2007 is the address of the protection relay 102 or a multi-cast address. Therefore, the network processing unit 1403 outputs the physical amount data frame 2007 to the DEMUX 1405.

When the destination address of the physical amount data frame 2007 is a multi-cast address, the network processing unit 1403 outputs the physical amount data frame 2007 to the network interface 1402. The network interface 1402 transmits the physical amount data frame 2007 to the network. The output physical amount data frame 2007 is transmitted to the network.

Then, the DEMUX 1405 outputs the physical amount data frame 2007 to the time stamp correcting unit 1410 (Step S2102). The time stamp correcting unit 1410 converts the time described in the physical amount data frame 2007 into the time of the relay 1400.

A time conversion method in Step S2102 will be described in detail below. First, the time stamp correcting unit 1410 searches for the record matched with the transmission source address of the physical amount data frame 2007 from the table shown in FIG. 17. The time stamp correcting unit 1410 acquires the clock rate C_rate, the converted time T_sync_est_recv of the measuring device 107 when the previous Sync message 2007 is received, and the time T_sync_recv_r of the protection relay 1400 from the record searched from the table.

Then, the time stamp correcting unit 1410 converts the measurement time T_measured_m described in the physical amount data frame 2007 into the time T_measured_r of the protection relay 1400 using following Expressions (13) and (14) on the basis of the scale value "scale," the clock rate C_rate, the time T_sync_est_recv, and the time T_sync_recv_r and stores the converted time in the storage unit 1412:

$$D\_from\_sync = (T\_measured\_m - T\_sync\_est\_recv) \times C\_rate/scale \qquad (13)$$

$$T\_measured\_r = T\_sync\_r + D\_from\_sync \qquad (14)$$

The value D_from_sync is the time of the protection relay 1400 and indicates the time from the reception of the previous Sync message B2001 to the transmission of the physical amount data frame 2007.

Then, the relay arithmetic unit 1411 verifies whether there is a problem in the transmission line 117 on the basis of the time-series data stored in the storage unit 1412 (Step S2103). The measurement time of the time-series data stored in the storage unit 1412 is converted into the time of the protection relay 1400. Therefore, the relay arithmetic unit 1411 can compare the time-series data items obtained from a plurality of measuring devices. An algorithm used to detect a problem is not particularly limited. For example, when there is a large difference between the time-series data obtained from the measuring device 106 and the time-series data obtained from the measuring device 107, the relay arithmetic unit 1411 may determine that there is a problem in the transmission line 117.

Then, in Step S2104, the process of the relay arithmetic unit 1411 is branched on the basis of the verification result in Step S2103. When the relay arithmetic unit 1411 determines that there is no problem in the transmission line 117 in Step S2103, a series of processes in the flowchart of FIG. 20 ends and the protection relay 1400 ends the process of the third sequence.

On the other hand, when the relay arithmetic unit 1411 determines that there is a problem in the transmission line 117 in Step S2103, the protection relay 1400 transmits a trip message to the breaker controller 120 (Step S2105). Specifically, in Step S2105, the relay arithmetic unit 1411 interrupts the CPU 1407. In response to the interruption, the CPU 1407 generates a message (hereinafter, referred to as a trip message) for instructing breaking according to the program stored in the storage unit 1412.

Then, the CPU 1407 instructs the DMA controller 1408 to transmit the trip message. The MUX 1406 acquires the trip message from the DMA controller 1408 and outputs the trip message to the network processing unit 1403. The network processing unit 1403 performs a MAC process and outputs the trip message to the network interface 1401 and the network interface 1402. The network interface 1401 and the network interface 1402 transmit the trip message to the breaker controller 120. When receiving the trip message, the breaker controller 120 transmits a trip signal to the breaker 111. When receiving the trip signal, the breaker 111 immediately discontinues the electrical flow on the transmission line 117.

As described above, according to the second embodiment, even when different measuring devices measure the physical amount at different times, the protection relay receiving the physical amount data frame can compare the time-series data items since it convert the measurement time into its own time. Therefore, a time server that distributes time to all devices in the system is not needed.

For example, even when the protection relay 102 is out of order or there is an error in the time of the protection relay 102, the bus protection relay 130 is not affected by the failure or the error. Therefore, the bus protection relay 130 can exactly compare the time-series data items of the physical amounts obtained from a plurality of measuring devices. As a result, the use of the protection relay and the bus protection relay according to the second embodiment makes it possible to improve the reliability of the substation.

When the protection relay and the bus protection relay according to the second embodiment is applied to a transmission line protection system, the measuring device does not need to include a PLL for each of the protection relay and the bus protection relay, which are the transmission destinations of the physical amount. Therefore, it is easy to expand the system. In contrast, in a method of determining measurement time using the measuring device that has one PLL for each device, the number of measuring devices supported by the protection relay is limited to the number of PLLs in the measuring device and expandability is reduced.

In the second embodiment, it is not necessary to connect the protection relay or the bus protection relay and the measuring device in a one-to-one correspondence. Therefore, it is possible to form a network with flexibility according to the requirements of the substation. For example, the transmission line protection system according to the second embodiment may be constructed by the double star network described with reference to FIG. 10. In this case, the operation of the protection relay and the bus protection relay according to the second embodiment is the same as that in the second embodiment except that a received frame is not transmitted when the destination address of the received frame is a multi-cast address or is not the address of the device. The transmission line protection system according to the second embodiment may be constructed by the single star network described with reference to FIG. 11.

The transmission line protection system according to the second embodiment can reduce the amount of data related to time which is transmitted or received. In the typical substation, time is less frequently calculated than the physical amount. The protection relay and the bus protection relay according to the second embodiment perform the process of calculating the time of the measuring device and the process of verifying whether there is a problem in the transmission line in different sequences. Therefore, it is possible to reduce the amount of data related to time which is transmitted or received.

However, the embodiment is not limited thereto. The protection relay and the bus protection relay according to the second embodiment may process an integrated message in which the Sync message B and the physical amount data frame are integrated with each other. The integrated message includes the value of the physical amount, the transmission time of the integrated message, and the Correction field. The time calculating unit 1409 of the protection relay 1400 checks the time of the measuring device using the transmission time of the integrated message and the value of the Correction field instead of the transmission time of the Sync message B and the value of the Correction field. In addition, the time stamp correcting unit 1410 of the protection relay 1400 uses the transmission time of the integrated message and the value of the physical amount instead of the physical amount data frame.

The time calculating unit 1409 of the protection relay 1400 according to the second embodiment may process the Sync message B transferred between the network interface 1401 and the network interface 1402. In this case, the Sync message B is transmitted to the time calculating unit 1409 through the network processing unit 1403 and the DEMUX 1405. The time calculating unit 1409 calculates estimated processing time and describes the value of the estimated processing time in the Sync message B.

Then, the time calculating unit 1409 outputs the Sync message B from a network interface different from the network interface which receives the Sync message B through the MUX 1406 and the network processing unit 1403. All processes for the Sync message B are integrated into the time calculating unit 1409. In this way, it is possible to reduce the circuit size of the protection relay and the bus protection relay.

First Modification of Second Embodiment

Figure 21:
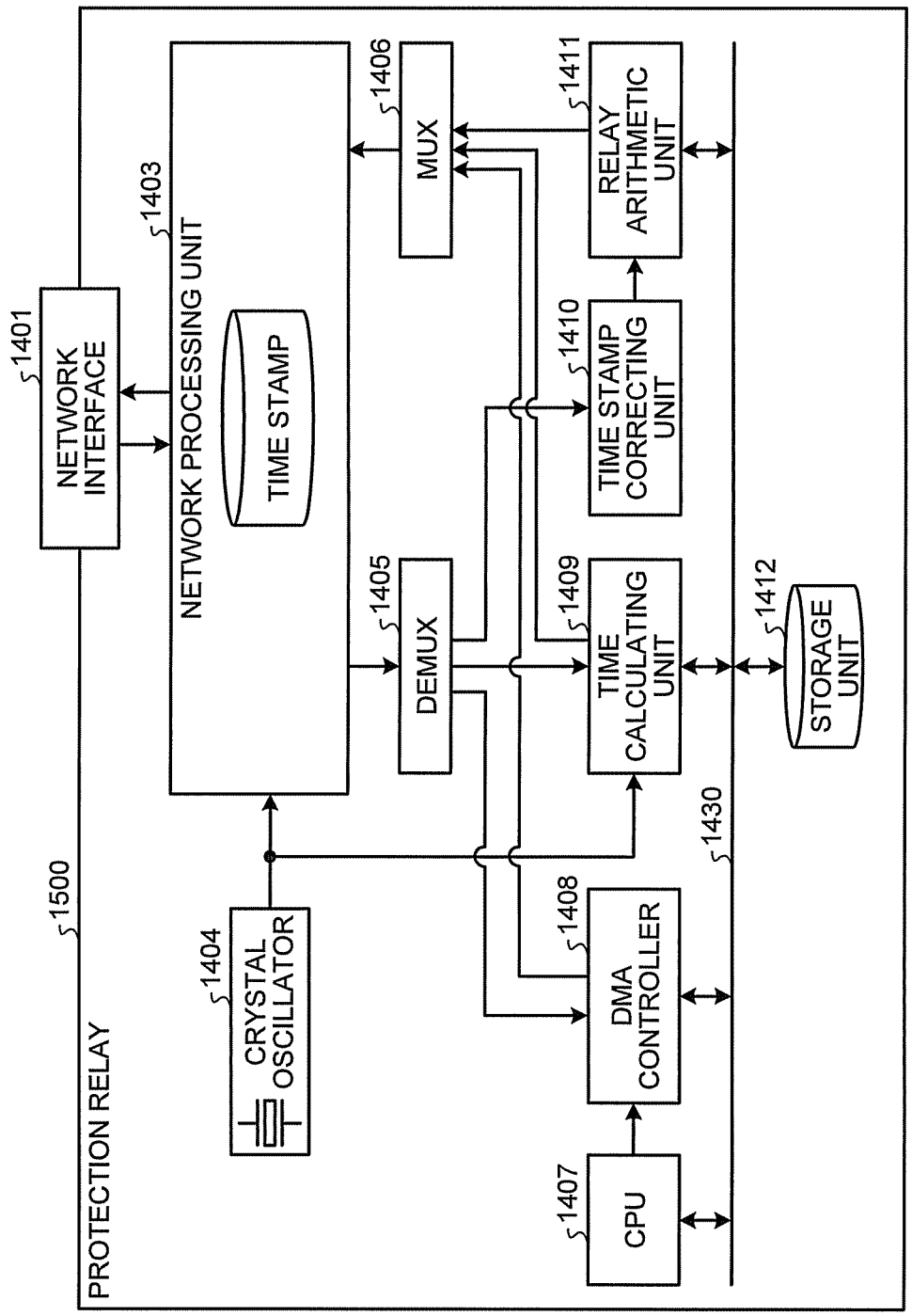
FIG. 21 is a diagram illustrating the structure of a protection relay according to a first modification of the second embodiment.

Next, a first modification of the second embodiment will be described. A protection relay 1500 shown in FIG. 21 is different from the protection relay 1400 according to the second embodiment described with reference to FIG. 15 in that the network interface 1402 is not provided and only one network interface is provided. In FIG. 21, the same components as those in FIG. 15 are denoted by the same reference numerals and a detailed description thereof will not be repeated.

The protection relay 1500 is different from the protection relay 1400 shown in FIG. 15 in that it outputs the frame received by the network interface 1401 to the DEMUX 1405 and outputs the frame input to the MUX 1406 to the network interface 1401. When the destination address of the frame received by the network interface 1401 is a multi-cast address, the protection relay 1500 does not transmit the frame.

The protection relay 1500 according to the first modification of the second embodiment may be used as the protection relays 101' to 103' and the bus protection relay 130' of the transmission line protection system constructed by the single star network which is described with reference to FIG. 11.

Second Modification of Second Embodiment

Figure 22A:
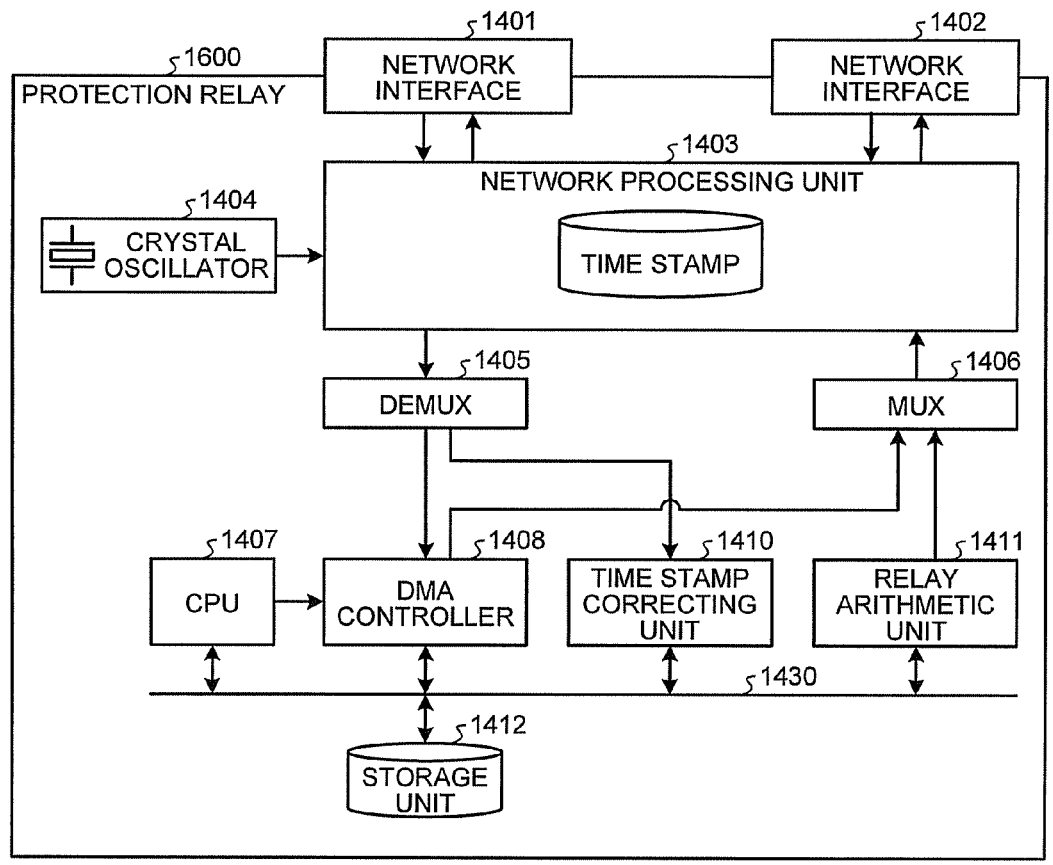
FIG. 22A is a diagram illustrating the structure of a protection relay according to a second modification of the second embodiment.
Figure 22B:
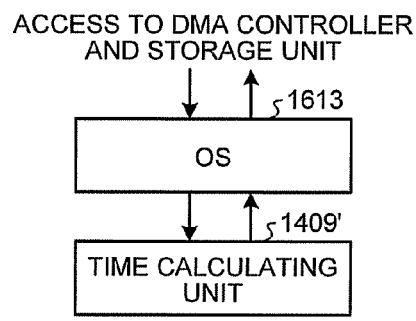
FIG. 22B is a diagram illustrating the structure of the protection relay according to the second modification of the second embodiment.

Next, a second modification of the second embodiment will be described. A protection relay 1600 shown in FIG. 22A is an example in which a portion of the structure of the protection relay 1400 according to the second embodiment described with reference to FIG. 15 is implemented by software operated on the CPU 1407. In FIGS. 22A and 22B, components having the same functions as those in FIG. 15 are denoted by the same reference numerals and a detailed description thereof will not be repeated.

In this example, the protection relay 1600 includes, as hardware components, network interfaces 1401 and 1402, a network processing unit 1403, a crystal oscillator 1404, a DEMUX 1405, a MUX 1406, a CPU 1407, a DMA controller 1408, a time stamp correcting unit 1410, a relay arithmetic unit 1411, a storage unit 1412, and a bus 1430. The CPU 1407, the DMA controller 1408, the time stamp correcting unit 1410, the relay arithmetic unit 1411, and the storage unit 1412 are connected to the bus 1430 so as to communicate with each other.

As shown in FIG. 22S, in the protection relay 1600, a time calculating unit 1409' is formed by software that is operated on an operating system (OS) 1613 executed on the CPU 1407. The time calculating unit 1409' has the same function as the time calculating unit 1409, which is a hardware component shown in FIG. 15. The time calculating unit 1409' accesses, for example, the DMA controller 1408 or the storage unit 1412 through the OS 1613.

For example, a program for forming the time calculating unit 1409' is stored in the storage unit 1412 in advance. When the protection relay 1600 starts, the CPU 1407 reads the program from the storage unit 1412 and executes the program. Then, each module is expanded on a RAM (not shown) and the time calculating unit 1409' is formed on the RAM.

As described above, some of the functions of the protection relay 1600 are implemented by software that is operated on the CPU 1407. Therefore, it is possible to reduce the circuit size of the protection relay 1600. In addition, the protection relay 1600 according to the second modification of the second embodiment may not include the network interface 1402 and may include only one network interface 1401, similarly to the protection relay 1500 according to the first modification of the second embodiment.

Third Modification of Second Embodiment

Figure 23A:
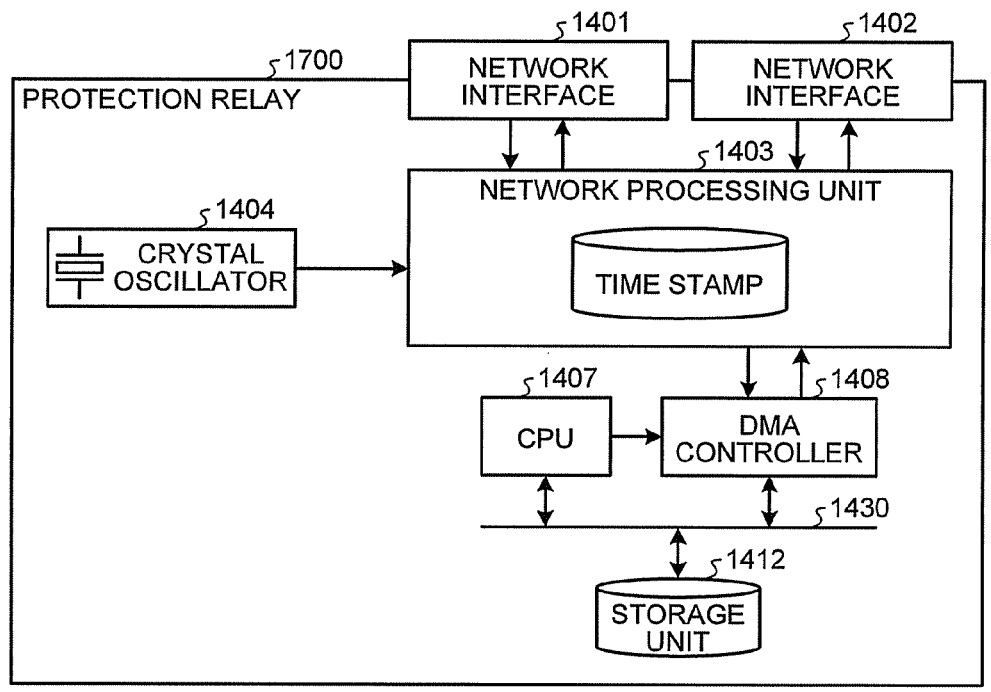
FIG. 23A is a diagram illustrating the structure of a protection relay according to a third modification of the second embodiment.
Figure 23B:
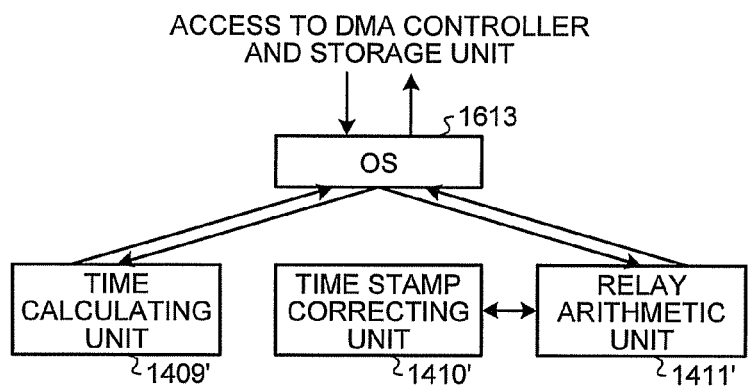
FIG. 23B is a diagram illustrating the structure of the protection relay according to the third modification of the second embodiment.

Next, a third modification of the second embodiment will be described. A protection relay 1700 shown in FIG. 23A is an example in which many components of the protection relay 1400 according to the second embodiment described with reference to FIG. 15 are implemented by software that is operated on the CPU 1407. In FIGS. 23A and 23B, components having the same functions as those in FIG. 15 and FIGS. 22A and 22B are denoted by the same reference numerals and a detailed description thereof will not be repeated.

In this example, as shown in FIG. 23A, the protection relay 1700 includes, as hardware components, network interfaces 1401 and 1402, a network processing unit 1403, a crystal oscillator 1404, a CPU 1407, a DMA controller 1408, a storage unit 1412, and a bus 1430. The CPU 1407, the DMA controller 1408, and the storage unit 1412 are connected to the bus 1430 so as to communicate with each other.

As shown in FIG. 23B, in the protection relay 1700, a time calculating unit 1409', a time stamp correcting unit 1410', and a relay arithmetic unit 1411' are formed by software that is operated on an operating system (OS) 1613 executed on the CPU 1407. The time calculating unit 1409', the time stamp correcting unit 1410', and the relay arithmetic unit 1411' have the same functions as the time calculating unit 1409, the time stamp correcting unit 1410, and the relay arithmetic unit 1411, which are hardware components shown in FIG. 15. The time calculating unit 1409', the time stamp correcting unit 1410', and the relay arithmetic unit 1411' access, for example, the DMA controller 1408 or the storage unit 1412 through the OS 1613.

As such, since the functions of many components of the protection relay 1700 are implemented by software that is operated on the CPU 1407, it is possible to significantly reduce the circuit size of the protection relay 1700. For example, according to the third modification of the second embodiment, it is possible to further reduce a circuit size, as compared to the second modification of the second embodiment. In addition, the protection relay 1700 according to the third modification of the second embodiment may not include the network interface 1402 and may include only one network interface 1401, similarly to the protection relay 1500 according to the first modification of the second embodiment.

A program executed by the protection relay 1600 or 1700 according to the second and third modifications of the second embodiment is stored in, for example, the storage unit 1412 in advance and is then provided. However, the embodiment is not limited thereto. For example, the program may be provided to the protection relay 1600 or 1700 through a network. In this case, for example, a frame including the program is received by the network interface 1401 or 1402 and is then stored in the storage unit 1412 through the network processing unit 1403 and the DMA controller 1408.

However, the embodiment is not limited thereto. The program may be recorded as a file of an installable format or an executable format on a computer-readable recording medium, such as a compact disk (CD), a flexible disk (FD), or a digital versatile disk (DVD) and then provided. In this case, a drive device that can read the recording medium is connected to the bus 1430. Then, the recording medium having the program recorded thereon is inserted into the drive device and the program is read from the recording medium and is then stored in the storage unit 1412.

Each embodiment and each modification of each embodiment may be applied to systems other than the protection system in the substation. For example, a control device that controls an external apparatus using the physical amounts measured by measuring devices at a plurality of points is used in an automation system, a sensor network, or an ad-hoc network installed in, for example, factories, vehicles, airplanes, trains, ships, and power stations. The control device performs the same operation as the protection relay according to each embodiment, and the measuring device performs the same operation as the measuring device according to each embodiment. Therefore, it is possible to construct a synchronization system with high reliability and high network flexibility. In addition, instead of the trip, the control device may transmit a message in which the amount of control for controlling an external apparatus is described to the external apparatus.

Comparison with Related Art

The measuring device according to each embodiment does not need to be connected one-to-one to the protection relay or the bus protection relay, which is the transmission destination of the physical amount. Therefore, it is not necessary to lay a large number of cables in the long distance in the substation and it is possible to construct a flexible network according to the requirements of the substation.

In contrast, U.S. Pat. No. 7,693,607 and J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009 disclose protection systems in which a digital network is used to reduce the amount of the cable in the substation. In the protection systems, measuring devices that are provided close to power lines digitalize physical amounts input through a plurality of analog cables and transmit the digital data to a protection relay through one cable. U.S. Pat. No. 7,693,607 and J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009 disclose a method of synchronizing the measurement time of the physical amounts by a plurality of measuring devices.

However, the method disclosed in U.S. Pat. No. 7,693,607 and J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009 does not achieve flexibility in the structure of the network and the prevention of the spread of failure. For example, J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009 discloses a line protection system which is constructed using Ethernet (registered trademark) in the substation. In this system, a plurality of protection relays and a plurality of measuring devices are connected in a ring shape by Ethernet (registered trademark). Each device receives data from an adjacent device that is connected thereto and transmits the data to another adjacent device that is connected thereto. In the system disclosed in J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009, since Ethernet (registered trademark) is used as the digital network, the transmission time of the device is changed each time transmission is performed.

The system disclosed in J.-C. Tournier, K. Weber, and C. Hoga, "Precise Time Synchronization on a High Available Redundant Ring Protocol," in Proc. IEEE International Symposium on Precision Clock Synchronization for Measurement, Control and Communication (ISPCS 2009), Brescia, Italy, October 2009 can accurately measure a transmission delay in the network constructed by Ethernet (registered trademark) using a time synchronization protocol IEEE 1588. That is, in the system disclosed in J.-C. Tournier, K. Weber, and C. Hoga, "Precise Time Synchronization on a High Available Redundant Ring Protocol," in Proc. IEEE International Symposium on Precision Clock Synchronization for Measurement, Control and Communication (ISPCS 2009), Brescia, Italy, October 2009, a time server which is called a grand master clock distributes time and a plurality of devices synchronize their own time with the time of the grand master clock. In this way, time synchronization between the plurality of devices is achieved.

In the power system protection system disclosed in J.-C. Tournier, K. Weber, and C. Hoga, "Precise Time Synchronization on a High Available Redundant Ring Protocol," in Proc. IEEE International Symposium on Precision Clock Synchronization for Measurement, Control and Communication (ISPCS 2009), Brescia, Italy, October 2009, when there is an error in the grand master clock, it is difficult for all protection relays in the power system protection system to protect the power system.

In general, the protection relays in the power system protection system monitor different areas of the power system. For example, it is preferable that, even when there is a problem in the protection relay or the measuring device that monitors one area, a device that monitors another area normally operate, regardless of the error.

In contrast, in the power system protection system disclosed in J.-C. Tournier, K. Weber, and C. Hoga, "Precise Time Synchronization on a High Available Redundant Ring Protocol," in Proc. IEEE International Symposium on Precision Clock Synchronization for Measurement, Control and Communication (ISPCS 2009), Brescia, Italy, October 2009, since all devices are affected by the reliability of the grand master clock, there is a concern that the reliability of the power system protection system will be significantly reduced. Even when a redundant grand master clock is provided, the error of the grand master clock is likely to be spread to the entire power system protection system. This problem also arises even when the system is constructed by a star network, not a ring-type network.

In the first embodiment and each modification of the first embodiment, a plurality of measuring devices that transmits the physical amount data frames to the same protection relay determines the measurement time of the physical amount on the basis of the time of the same protection relay. Therefore, the measuring devices can measure the physical amounts at the same time. Even when one protection relay is out of order, the measurement time of the physical amount to be transmitted to another protection relay is not affected by the failure. In the second embodiment and each modification of the second embodiment, the protection relay converts the measurement times of the physical amounts transmitted from different measuring devices into its own time. Therefore, the protection relay can know the relation between the measurement times of different measuring devices. The protection relay can compare time-series data items obtained by the values of the physical amounts of each measuring device to verify whether a problem, such as an overcurrent, occurs. Even when one protection relay is out of order, a time conversion process of another protection relay is not affected by the failure. Therefore, each embodiment and each modification of each embodiment can prevent the spread of a problem to a wide range which is likely to occur in J.-C. Tournier, K. Weber, and C. Hoga, "Precise Time Synchronization on a High Available Redundant Ring Protocol," in Proc. IEEE International Symopsium on Precision Clock Synchronization for Measurement, Control and Communication (ISPCS 2009), Brescia, Italy, October 2009.

U.S. Pat. No. 7,693,607 discloses the protection system in which a set of a protection relay and a measuring device is connected to one optical fiber cable. In the system disclosed in U.S. Pat. No. 7,693,607, since no transmission device is provided between the protection relay and the measuring device, it is possible to maintain a transmission delay to be substantially constant. The measuring device disclosed in U.S. Pat. No. 7,693,607 transmits a digitalized physical amount to the protection relay at the time when a clock signal is received from the protection relay. The protection relay synchronizes the transmission time of the clock signal to a plurality of measuring devices, thereby synchronizing the measurement times of the physical amounts at a plurality of points.

However, in the system disclosed in U.S. Pat. No. 7,693,607, one cable is required for a set of one protection relay and one measuring device that communicate with each other. The system disclosed in U.S. Pat. No. 7,693,607 requires a large number of cables since it is difficult to construct a ring or start network in order to maintain a transmission delay to be constant.

In contrast, as described above, the measuring device according to each embodiment does not need to be connected one-to-one to the protection relay or the bus protection relay, which is the transmission destination of the physical amount. Therefore, it is not necessary to lay a large number of cables at a long distance in the substation and it is possible to construct a flexible network according to the requirements of the substation.

As described above, the first and second embodiments and each modification thereof can construct a protection system capable of improving the reliability of a time synchronization system and constructing a flexible network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A measuring device comprising:
a clock output unit that generates a clock, counts the clock, and outputs a count value;
a receiving unit that receives a first message including time information from each of a plurality of devices;
an adjusting unit that adjusts time at which acquires a physical amount on the basis of the time information included in the first message and the count value output from the clock output unit when the first message is received;

a generating unit that generates a second message including a value of the physical amount acquired at the adjusted time; and
a transmitting unit that transmits the second message to a device which is a transmission source of the first message,
wherein the adjusting unit obtains the times of the plurality of devices and uses an earliest time of the obtained times as a next time at which the physical amount is acquired.

2. The measuring device according to claim 1, wherein the time adjusting unit adjusts the measuring time, such that the measuring time interval indicated by the time of the device transmitting the first message, is substantially constant.

3. The measuring device according to claim 1, wherein when the interval of the times of the plurality of devices is less than a predetermined time, the time adjusting unit sets anyone of the times of the plurality of devices to the time at which the value of the physical amount is acquired.

4. A non-transitory computer readable medium encoded with a computer product including programmed instructions, wherein the instructions, when executed by the computer product, causes the computer product to perform:
   generating a clock, counting the clock, and outputting a count value;
   receiving a first message including time information from each of a plurality of devices;
   adjusting the time at which the physical amount is acquired on the basis of the time information included in the first message and the count value output when the first message is received;
   acquiring the physical amount at the adjusted time and generating a second message including a value of the physical amount; and
   transmitting the second message to a device which is a transmission source of the first message,
   wherein the adjusting includes obtaining the times of the plurality of devices and using an earliest time of the obtained times as a next time at which the physical amount is acquired.

* * * * *